US012641766B2

(12) United States Patent
Maeda

(10) Patent No.: US 12,641,766 B2
(45) Date of Patent: May 26, 2026

(54) IC CHIP-MOUNTING DEVICE AND IC CHIP-MOUNTING METHOD

(71) Applicant: SATO HOLDINGS KABUSHIKI KAISHA, Tokyo (JP)

(72) Inventor: Yoshimitsu Maeda, Tokyo (JP)

(73) Assignee: SATO CORPORATION, Tokyo (JP)

( * ) Notice: Subject to any disclaimer, the term of this patent is extended or adjusted under 35 U.S.C. 154(b) by 985 days.

(21) Appl. No.: 17/783,837

(22) PCT Filed: Dec. 25, 2020

(86) PCT No.: PCT/JP2020/048889
§ 371 (c)(1),
(2) Date: Jun. 9, 2022

(87) PCT Pub. No.: WO2021/132623
PCT Pub. Date: Jul. 1, 2021

(65) Prior Publication Data
US 2023/0021265 A1     Jan. 19, 2023

(30) Foreign Application Priority Data

Dec. 26, 2019   (JP) ................................. 2019-235420
Dec. 25, 2020   (JP) ................................. 2020-216460

(51) Int. Cl.
*H05K 13/08*          (2006.01)
*H05K 13/04*          (2006.01)
*H10P 72/00*          (2026.01)

(52) U.S. Cl.
CPC ..... *H05K 13/0812* (2018.08); *H05K 13/0409* (2018.08); *H05K 13/041* (2018.08);
(Continued)

(58) Field of Classification Search
CPC ......... G06K 19/07718; H05K 13/0812; H05K 13/0469; H05K 13/0409
See application file for complete search history.

(56) References Cited

U.S. PATENT DOCUMENTS

2004/0163243 A1     8/2004  Noda et al.
2007/0085069 A1     4/2007  Inoue et al.
(Continued)

FOREIGN PATENT DOCUMENTS

CN          102765252 A      11/2012
CN          203825037 U       9/2014
(Continued)

OTHER PUBLICATIONS

Office Action issued in connection with Chinese Appl. No. 202080085320.5 dated Jan. 22, 2025.
(Continued)

*Primary Examiner* — Livius R. Cazan
(74) *Attorney, Agent, or Firm* — Foley & Lardner LLP

(57) ABSTRACT

The present invention is an IC chip mounting apparatus including: a plurality of nozzles, each movable between a first position and a second position, each configured to suck an IC chip, when located at the first position, and to place the IC chip on the adhesive at the reference position of the corresponding antenna of an antenna continuous body, when located at the second position; a nozzle attachment to which the plurality of nozzles is attached; and a controller configured to control an angular velocity in rotating the nozzle attachment, so that a first nozzle of the plurality of nozzles that reaches the second position later than a non-sucking nozzle, places an IC chip on an antenna corresponding to the non-sucking nozzle, the non-sucking nozzle being a nozzle of the plurality of nozzles that has been determined as not sucking an IC chip.

19 Claims, 22 Drawing Sheets

(52) U.S. Cl.
CPC ..... *H05K 13/0411* (2018.08); *H05K 13/0882*
(2018.08); *H10P 72/0428* (2026.01)

(56) References Cited

U.S. PATENT DOCUMENTS

| | | | |
|---|---|---|---|
| 2007/0284759 | A1 | 12/2007 | Suguro et al. |
| 2010/0043203 | A1 | 2/2010 | Ferguson et al. |
| 2010/0096089 | A1 | 4/2010 | Lichtenberg et al. |
| 2010/0172737 | A1* | 7/2010 | Munn .............. G06K 19/07718 |
| | | | 414/798.3 |
| 2012/0281039 | A1 | 11/2012 | Mitsuzawa |
| 2012/0304459 | A1 | 12/2012 | Takayuki |
| 2013/0122610 | A1 | 5/2013 | Chung et al. |
| 2016/0052197 | A1 | 2/2016 | Yamada et al. |
| 2018/0053671 | A1 | 2/2018 | Cheng et al. |
| 2018/0303015 | A1 | 10/2018 | Koch et al. |
| 2019/0139795 | A1 | 5/2019 | Neo et al. |
| 2023/0019546 | A1 | 1/2023 | Maeda |

FOREIGN PATENT DOCUMENTS

| | | |
|---|---|---|
| CN | 110199379 A | 9/2019 |
| EP | 1 742 171 A1 | 1/2007 |
| EP | 1 833 290 A1 | 9/2007 |
| EP | 1 962 231 A2 | 8/2008 |
| JP | H06-029694 A | 2/1994 |
| JP | 11-157262 A | 6/1999 |
| JP | 2004-334639 A | 11/2004 |
| JP | 2005-209144 A | 8/2005 |
| JP | 2005-339502 A | 12/2005 |
| JP | 2006-309541 A | 11/2006 |
| JP | 2007-043086 A | 2/2007 |
| JP | 2007-183847 A | 7/2007 |
| JP | 2008-021167 A | 1/2008 |
| JP | 2008-077599 A | 4/2008 |
| JP | 2008-123406 A | 5/2008 |
| JP | 2011-198136 A | 10/2011 |
| JP | 2012-074570 A | 4/2012 |
| JP | 2012-206278 A | 10/2012 |
| JP | 2013-080795 A | 5/2013 |
| JP | 2015-053316 A | 3/2015 |
| JP | 2016-046281 A | 4/2016 |
| JP | 2016-133982 A | 7/2016 |
| JP | 6337271 B2 | 6/2018 |
| WO | WO-2019/057469 A1 | 3/2019 |

OTHER PUBLICATIONS

U.S. Appl. No. 17/782,744, filed Jun. 6, 2022, Yoshimitsu Maeda.
U.S. Appl. No. 17/783,376, filed Jun. 8, 2022, Yoshimitsu Maeda.
U.S. Appl. No. 17/783,386, filed Jun. 8, 2022, Yoshimitsu Maeda.
U.S. Appl. No. 17/783,819, filed Jun. 9, 2022, Yoshimitsu Maeda et al.
U.S. Appl. No. 17/783,830, filed Jun. 9, 2022, Yoshimitsu Maeda.
Non-Final Office Action in U.S. Appl. No. 17/783,819 dated Jun. 16, 2025.
U.S. Appl. No. 19/344,393, filed Sep. 29, 2025, Yoshimitsu Maeda.
Office Action issued in Chinese Appl. No. 202080084996.2 dated Oct. 31, 2025.
Office Action issued in Chinese Appl. No. 202080085319.2 dated Oct. 31, 2025.
Office Action issued in Japanese Appl. No. 2024-223808 dated Nov. 11, 2025.
Office Action issued in Japanese Appl. No. 2024-211941 dated Oct. 14, 2025.

* cited by examiner

ENLARGED VIEW OF "E" PART (BEFORE IC CHIP IS MOUNTED)

ENLARGED VIEW OF "E" PART (AFTER IC CHIP IS MOUNTED)

ENLARGED VIEW OF A–A SECTION

BEFORE ROTATED

AFTER ROTATED

SEEN FROM ARROW "J"

IC CHIP-MOUNTING DEVICE AND IC CHIP-MOUNTING METHOD

FIELD

The present invention relates to an IC chip mounting apparatus and an IC chip mounting method.

BACKGROUND

With the spread of RFID tags, production of sheet-shaped inlays having an antenna and an IC chip electrically connected to the antenna is increasing. Manufacturing of an inlay involves a process of placing a supplied IC chip on an antenna that is formed on a base material (for example, Japanese Unexamined Patent Application Publication No. 2008-123406). The IC chip is placed at a predetermined reference position on an antenna, which is a reference for mounting the IC chip.

Japanese Unexamined Patent Application Publication No. 2008-123406 discloses that a mounting apparatus among four IC chip mounting apparatuses works as a dedicated backup apparatus for mounting an IC chip on an antenna which the other three mounting apparatuses have not mounted an IC chip thereon.

BRIEF SUMMARY

Technical Problem

It is assumed that production yield is improved in a manufacturing process of inlays, with the dedicated backup apparatus provided, according to Japanese Unexamined Patent Application Publication No. 2008-123406; however, there are disadvantages from aspects of cost and space saving, as the dedicated backup apparatus has to be installed.

In view of this, an object of one aspect of the present invention is to improve production yield in a manufacturing process of inlays, without an additional apparatus provided.

Solution to Problem

An embodiment of the present invention is an IC chip mounting apparatus including an ejection unit configured to eject an adhesive toward a reference position of each antenna of an antenna continuous body, the antenna continuous body having a base material and plural inlay antennas continuously formed on the base material; a plurality of nozzles, each movable between a first position and a second position, each configured to suck an IC chip, when located at the first position, and to place the IC chip on the adhesive at the reference position of the corresponding antenna of the antenna continuous body, when located at the second position; a nozzle attachment to which the plurality of nozzles is attached; a rotating unit configured to rotate the nozzle attachment, such that the plurality of nozzles moves, on a surface orthogonal to the conveying surface, along a circular track, and a moving direction of each nozzle at the second position matches the conveying direction of the antenna continuous body; a determination unit configured to determine whether an IC chip is sucked by each nozzle while each nozzle is moved from the first position to the second position; and a controller configured to control an angular velocity in rotating the nozzle attachment, so that a first nozzle of the plurality of nozzles that reaches the second position later than a non-sucking nozzle, places an IC chip on an antenna corresponding to the non-sucking nozzle, the non-sucking nozzle being a nozzle of the plurality of nozzles that has been determined as not sucking an IC chip.

Advantageous Effects

An embodiment of the present invention improves production yield in a manufacturing process of inlays, without an additional apparatus provided.

DETAILED DESCRIPTION

The present invention is related to Japanese Patent Application Nos. 2019-235420 and 2020-216460 respectively filed with the Japan Patent Office on Dec. 26, 2019 and on Dec. 25, 2020, the entire contents of which are incorporated into this specification by reference.

Hereinafter, an IC chip mounting apparatus and an IC chip mounting method according to an embodiment will be described with reference to drawings.

An IC chip mounting apparatus 1 according to the embodiment is an apparatus for mounting an IC chip on a thin film antenna in manufacturing a contactless communication inlay, such as an RFID inlay.

Figure 1:
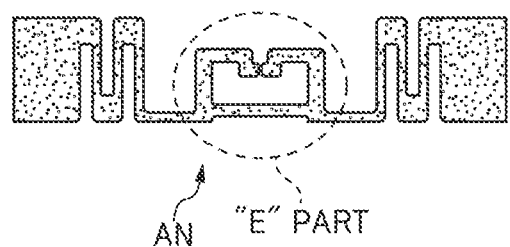
FIG. 1 shows a plane view of an antenna of an embodiment and partially enlarged views of the antenna before and after an IC chip is mounted.
Figure 1:
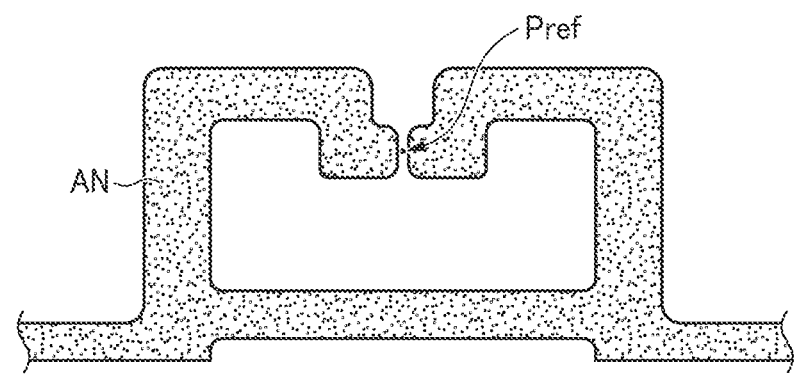
Figure 1:
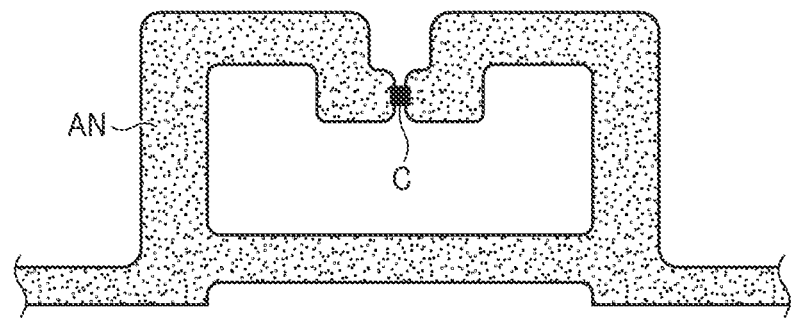

FIG. 1 shows an exemplary antenna AN having a predetermined antenna pattern, but there is no intention to limit the antenna pattern thereto. FIG. 1 also shows enlarged views of an "E" part before and after an IC chip "C" is mounted on the antenna AN. In this example, an IC chip "C" is mounted at a predetermined reference position Pref that is determined in advance based on the antenna pattern. The IC chip "C" has such a very small size as several hundreds of micrometers in length and width dimensions, and this very small IC chip "C" is required to be mounted exactly at the reference position Pref.

Mounting the IC chip "C" on the antenna AN involves an IC chip placement process and a curing process. In the IC chip placement process, an adhesive is applied to the reference position Pref of the antenna AN, and the IC chip "C" is placed on the adhesive. In the curing process, the adhesive is cured to strongly connect the antenna AN and the IC chip "C".

Figure 2:
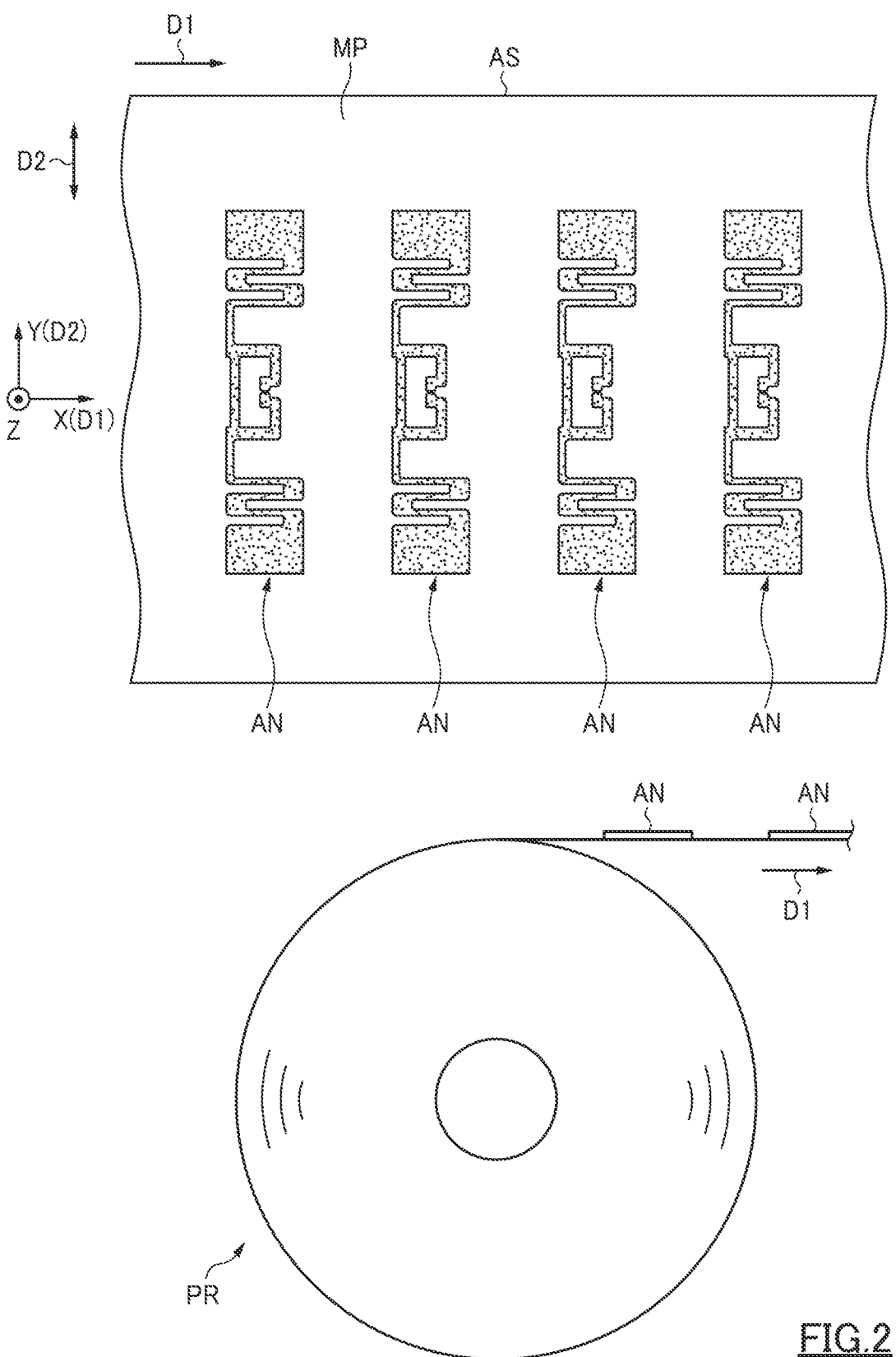
FIG. 2 shows an antenna sheet and a roll of the antenna sheet.

In the IC chip placement process (described later), a roll PR of a strip antenna sheet AS (an example of an antenna continuous body), as shown in FIG. 2, is set. The antenna sheet AS includes a plurality of antennas AN formed on a base material BM with constant pitches. The antenna sheet AS is continuously pulled out of the roll PR and is provided to a line of the IC chip placement process.

Examples of the material that can be used for the base material BM include, but not specifically limited to, paper base materials such as fine paper, coated paper, and art paper, synthetic resin films made of polyethylene terephthalate (PET), polyethylene (PE), polypropylene (PP), or polystyrene (PS), sheets made of a plurality of these synthetic resins, and composite sheets of a synthetic resin film and paper.

The antenna AN is formed, for example, by attaching a metal foil to a base material BM or by screen-printing or vapor-depositing a conductive material into a predetermined pattern on a base material BM.

In the following description, an XYZ coordinate system is defined as shown in FIG. 2. The following describes a front view as a YZ-plane view, a plane view as an XY-plane view, and a side view as an XZ-plane view in referring to the drawings of components set in each process.

The X-direction is a direction of conveying the antenna sheet AS, which is pulled out of the roll PR, in each process described below, and it is also called a "conveying direction D1" as appropriate. In addition, the Y-direction is a width direction of the antenna sheet AS and is also called a "width direction D2" as appropriate. The Z-direction is a direction orthogonal to the antenna sheet AS.

(1) IC Chip Placement Process

Figure 3:
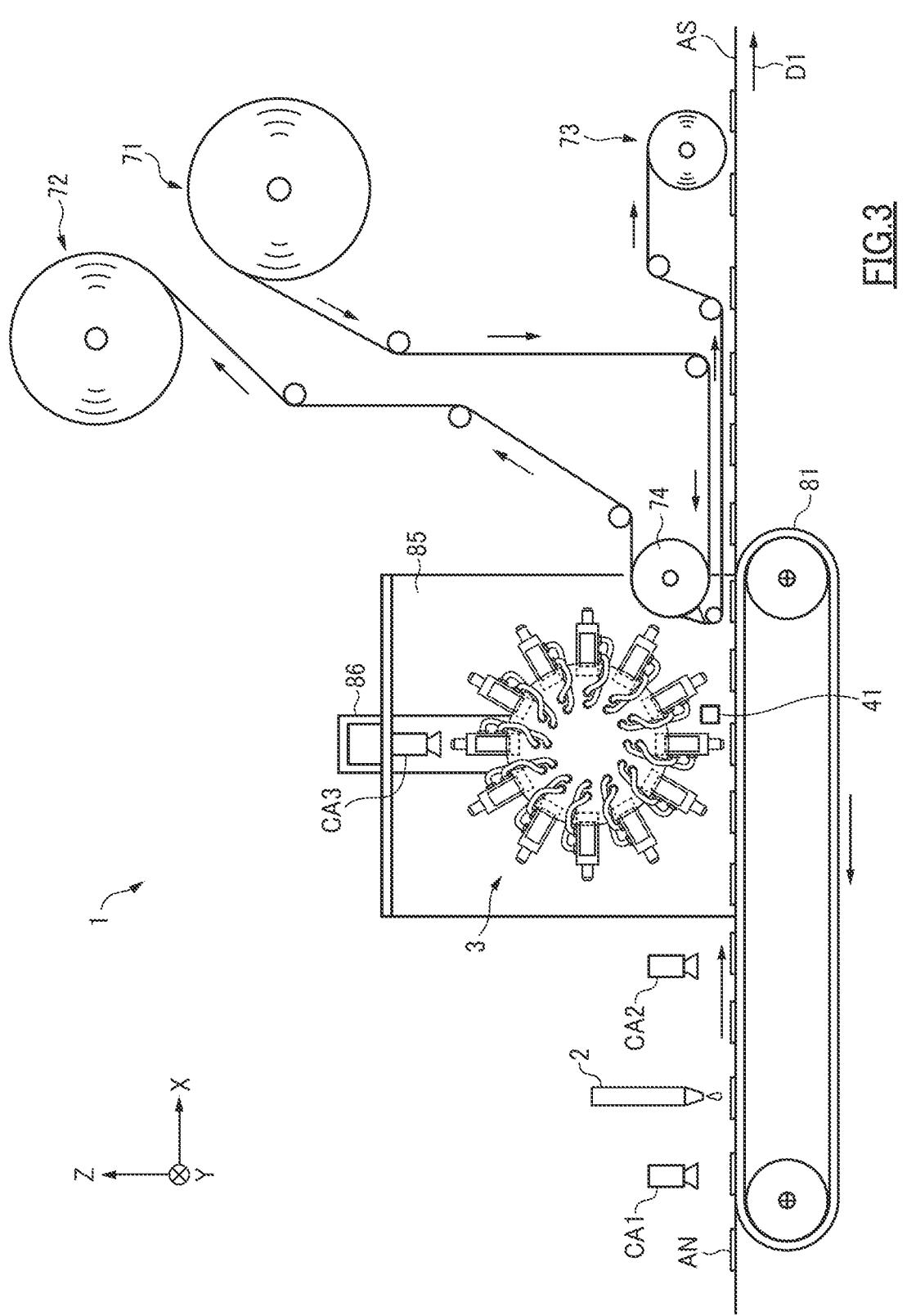
FIG. 3 shows an area corresponding to an IC chip placement process of an IC chip mounting apparatus of an embodiment.
Figure 4:
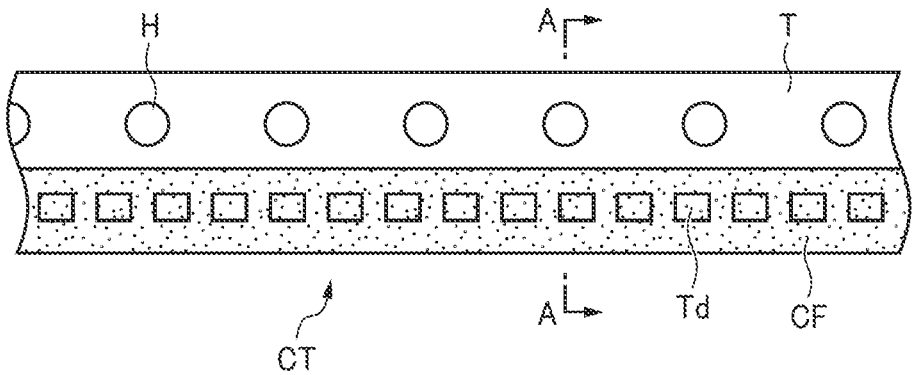
FIG. 4 shows a chip-containing tape and an enlarged sectional view thereof.
Figure 4:
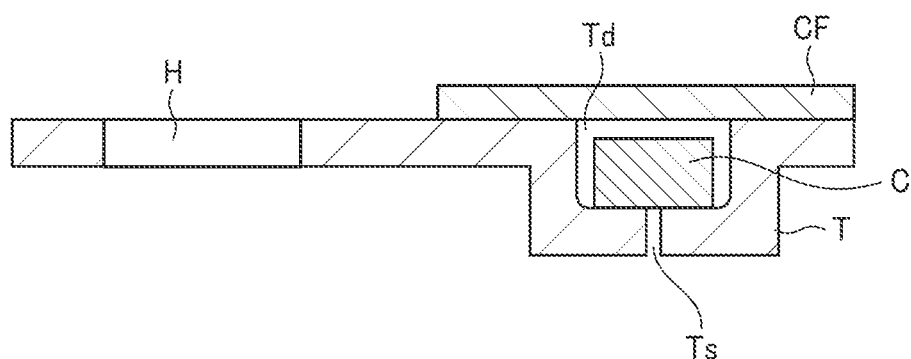

Hereinafter, the IC chip placement process will be described with reference to FIGS. 3 to 10. FIG. 3 shows an area corresponding to the IC chip placement process of the IC chip mounting apparatus 1 of this embodiment. FIG. 4 shows a plane view of a chip-containing tape CT and an enlarged view of an A-A section thereof.

In the IC chip placement process, the IC chip mounting apparatus 1 accurately places a very small IC chip at the reference position Pref (refer to FIG. 1) of each antenna AN on the antenna sheet AS.

As shown in FIG. 3, the IC chip mounting apparatus 1 includes a conveyor 81, a dispenser 2, a rotary mounter 3, an ultraviolet irradiator 41, image capture devices CA1 to CA3, a tape feeder 71, a tape body winding reel 72, a film winding reel 73, and a separation roller 74, in the IC chip placement process.

The conveyor 81 conveys the antenna sheet AS that is pulled out of the roll PR (refer to FIG. 2) to the downstream of the process at a predetermined conveying speed. An upper surface of the conveyor 81 corresponds to a conveying surface.

The dispenser 2 (an example of an ejection unit) ejects a fixed amount of anisotropic conductive paste (ACP; hereinafter simply called "conductive paste") to the reference position Pref of each antenna AN that is conveyed. This conductive paste is an example of an ultraviolet light curable adhesive. The dispenser 2 is configured so that the ejection position can be adjusted in the width direction, in order to accurately determine the ejection position relative to the reference position Pref of each antenna AN.

The image capture device CA1 is provided upstream of the dispenser 2 and captures an image of a part in the vicinity of the reference position Pref of each antenna AN, in order to determine the position to be applied with the conductive paste. The image capture device CA2 is provided downstream of the dispenser 2 and captures an image of a part in the vicinity of the reference position Pref of each antenna AN, in order to inspect whether the conductive paste is applied to each antenna AN and to inspect whether the conductive paste is applied exactly to a region including the reference position Pref.

The rotary mounter 3 is a chip mounter that places an IC chip on the conductive paste that is applied to each antenna AN, and it rotates in a counterclockwise direction in FIG. 3. The rotary mounter 3 is mounted to and suspended by a suspension plate 86. The suspension plate 86 is supported by a support stand 85, while movable in the Y-direction. Thereby, the rotary mounter 3 is suspended from above by the support stand 85, and moveable in the Y-direction.

As described later, the rotary mounter 3 sucks an IC chip from the chip-containing tape and places (mounts) the sucked IC chip by releasing it to the reference position Pref of each antenna AN on the antenna sheet AS. Meanwhile, in order to place the IC chip exactly at the reference position Pref of the antenna AN, the position and the direction of the sucked IC chip are corrected. The image capture device CA3 images the IC chip in the state of being sucked by a nozzle (described later), in order to perform a correction process of correcting the position and the direction of the IC chip in preparation for mounting it on the antenna AN.

The tape feeder 71 is configured to be loaded with a wound chip-containing tape that contains IC chips and to cause the chip-containing tape to be pulled out sequentially at a speed synchronized with the rotary mounter 3, in the arrow directions in FIG. 3.

Herein, an example of the chip-containing tape will be described with reference to FIG. 4.

As shown in FIG. 4, the chip-containing tape CT includes a tape body "T" and a cover film CF. Recesses Td for containing IC chips "C" are formed at fixed intervals in the tape body "T". The cover film CF is attached to the tape body "T" so as to cover the recesses Td. The recesses Td are formed, for example, by embossing the tape body "T". The IC chip "C" is contained in each recess Td along the extending direction of the chip-containing tape CT. The chip-containing tape CT has fitting holes H that are formed at fixed intervals in the extending direction. These fitting holes H are provided in order to accurately perform positioning relative to a circumferential surface of the separation roller 74. The fitting holes H are fitted to protrusions 74p (described later), which are provided to the separation roller 74, while the chip-containing tape CT is conveyed by the separation roller 74.

As shown in FIG. 4, a suction hole Ts is formed between a bottom surface of the recess Td and a back surface (surface on a side opposite to the surface attached with the cover film CF) of the tape body "T". The suction hole Ts is provided so as to make the separation roller 74 suck an IC chip "C", in order to prevent the IC chip "C" from falling out of the recess Td when the cover film CF is peeled off.

With reference to FIG. 3 again, the chip-containing tape CT is fed from the tape feeder 71 via one or a plurality of auxiliary rollers, and the cover film CF is peeled off from the chip-containing tape CT to be separated from the tape body "T" at the separation roller 74. The IC chip "C" is exposed upon peeling off the cover film CF and is sequentially sucked by each nozzle that is provided to the rotary mounter 3.

After the chip-containing tape CT is separated into the tape body "T" and the cover film CF by the separation roller 74, the tape body "T" is wound by the tape body winding reel 72 via one or a plurality of auxiliary rollers, whereas the cover film CF is wound by the film winding reel 73 via one or a plurality of auxiliary rollers.

Next, the rotary mounter 3 will be described with reference to FIGS. 5 to 7.

Figure 5:
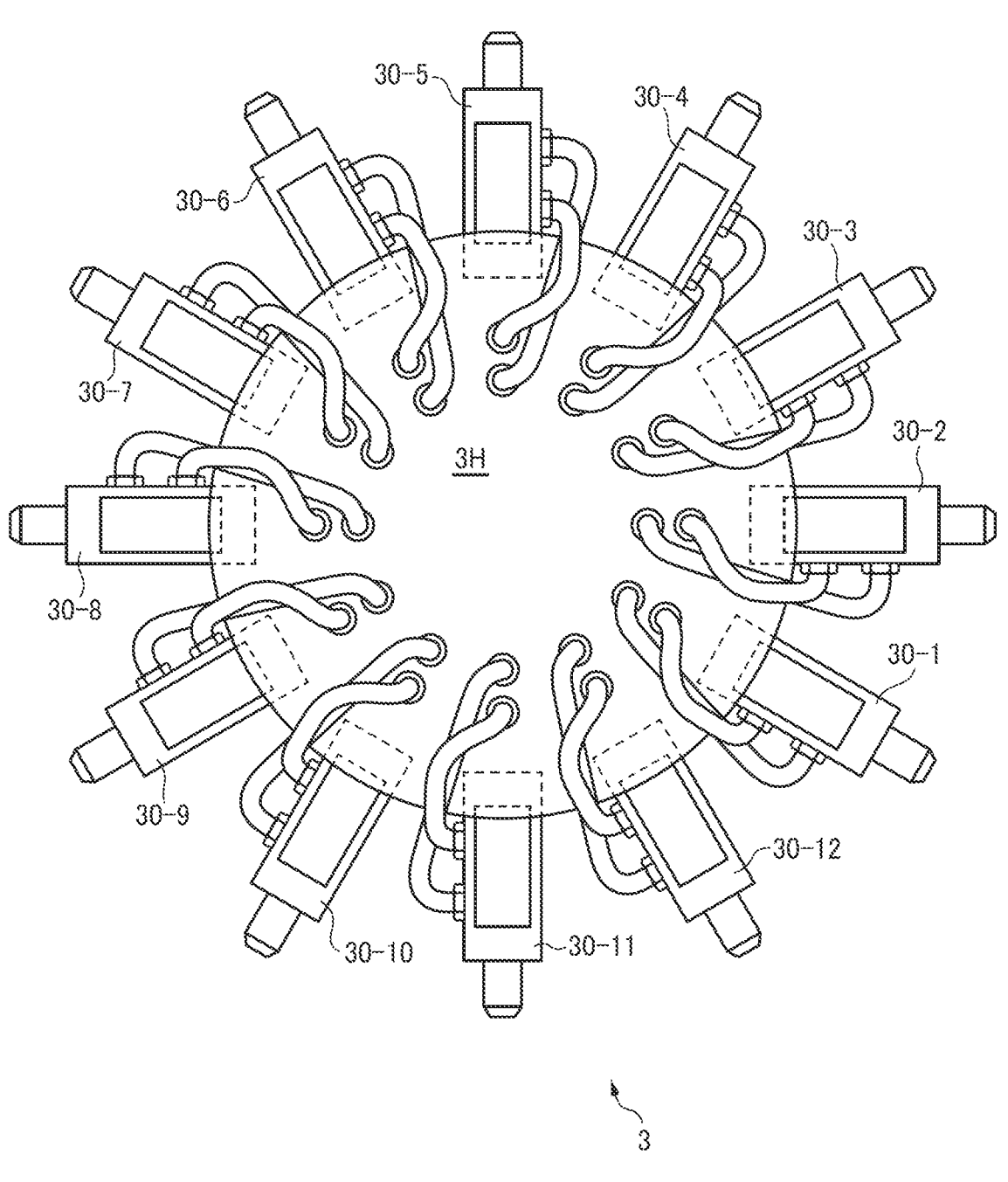
FIG. 5 is a side view of a rotary mounter of the IC chip mounting apparatus of the embodiment.
Figure 6A:
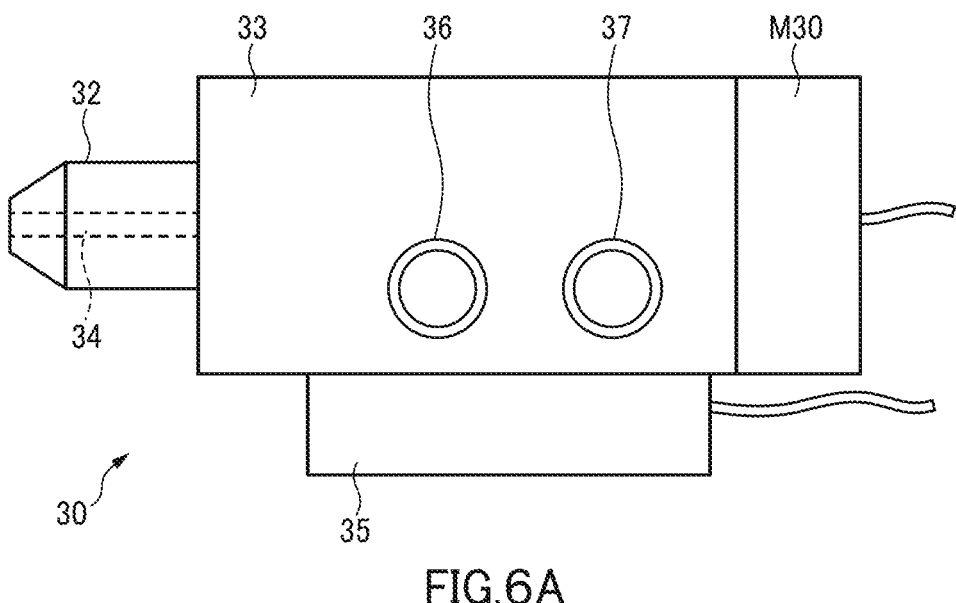
FIG. 6A is a plan view of a nozzle unit included in the rotary mounter.
Figure 6B:
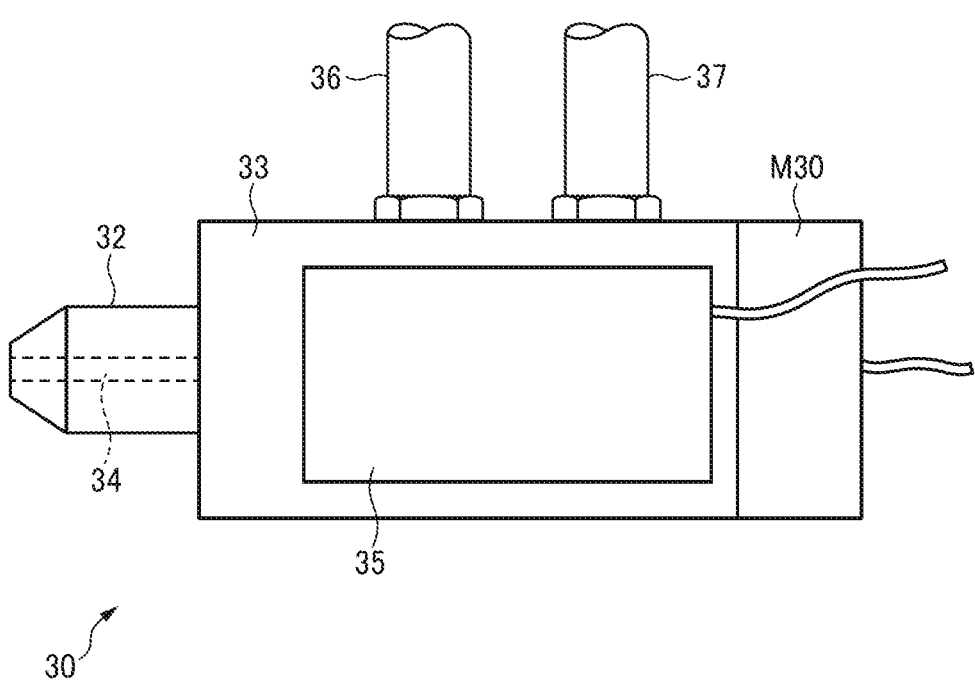
FIG. 6B is a side view of a nozzle unit included in the rotary mounter.

FIG. 5 is a side view of the rotary mounter 3 of the IC chip mounting apparatus 1 of this embodiment. FIG. 6A is a plane view of a nozzle unit mounted on the rotary mounter 3. FIG. 6B is a side view of nozzle units 30. FIG. 7 schematically illustrates a relation between the rotary mounter 3 and the antenna sheet AS.

As shown in FIG. 5, a plurality of nozzle units (twelve units in the example of the drawing) 30-1 to 30-12 are arranged radially from a rotary head 3H (an example of a nozzle attachment) in the rotary mounter 3. The following collectively describes the nozzle units 30-1 to 30-12 as "nozzle units 30" when referring to matters that are common therebetween.

Although not illustrated in detail, the rotary head 3H is connected to a rotary drive motor, a vacuum pump, and a blower. The rotary drive motor rotates the nozzle units 30-1 to 30-12 in a counterclockwise direction in FIG. 5. The vacuum pump causes the nozzle unit 30 to suck an IC chip. The blower causes the nozzle unit 30 to release the IC chip.

Referring to FIG. 6, the nozzle unit 30 is comprised of a nozzle 32, a sleeve 33, a solenoid valve 35, and a cylinder drive motor M30. The nozzle 32 is provided at a tip of the nozzle unit 30 and connected to the cylinder drive motor M30 in the sleeve 33. The cylinder drive motor M30 is a motor (e.g., a stepping motor) that rotates the nozzle 32 around an axis thereof. A path that can be communicated with an suction tube 36 and an exhaust tube 37 is formed in the nozzle 32.

The suction tube 36 and the exhaust tube 37 are coupled with the sleeve 33. The suction tube 36 is connected to a vacuum pump (not illustrated), while the exhaust tube 37 is connected to a blower (not illustrated).

The solenoid valve 35 (an example of a control valve) may be a three-port valve, for example, that is configured to, in response to current-applying condition, either open a path between a path 34 of the nozzle 32 and the suction tube 36, thereby closing the exhaust tube 37, or open a path between the path 34 of the nozzle 32 and the exhaust tube 37, thereby closing the suction tube 36. The solenoid valve 35 is configured to perform either a suction operation for sucking by the nozzle 32 through the suction tube 36, or an exhaust operation for exhausting air from the nozzle 32 through the exhaust tube 37.

Figure 7:
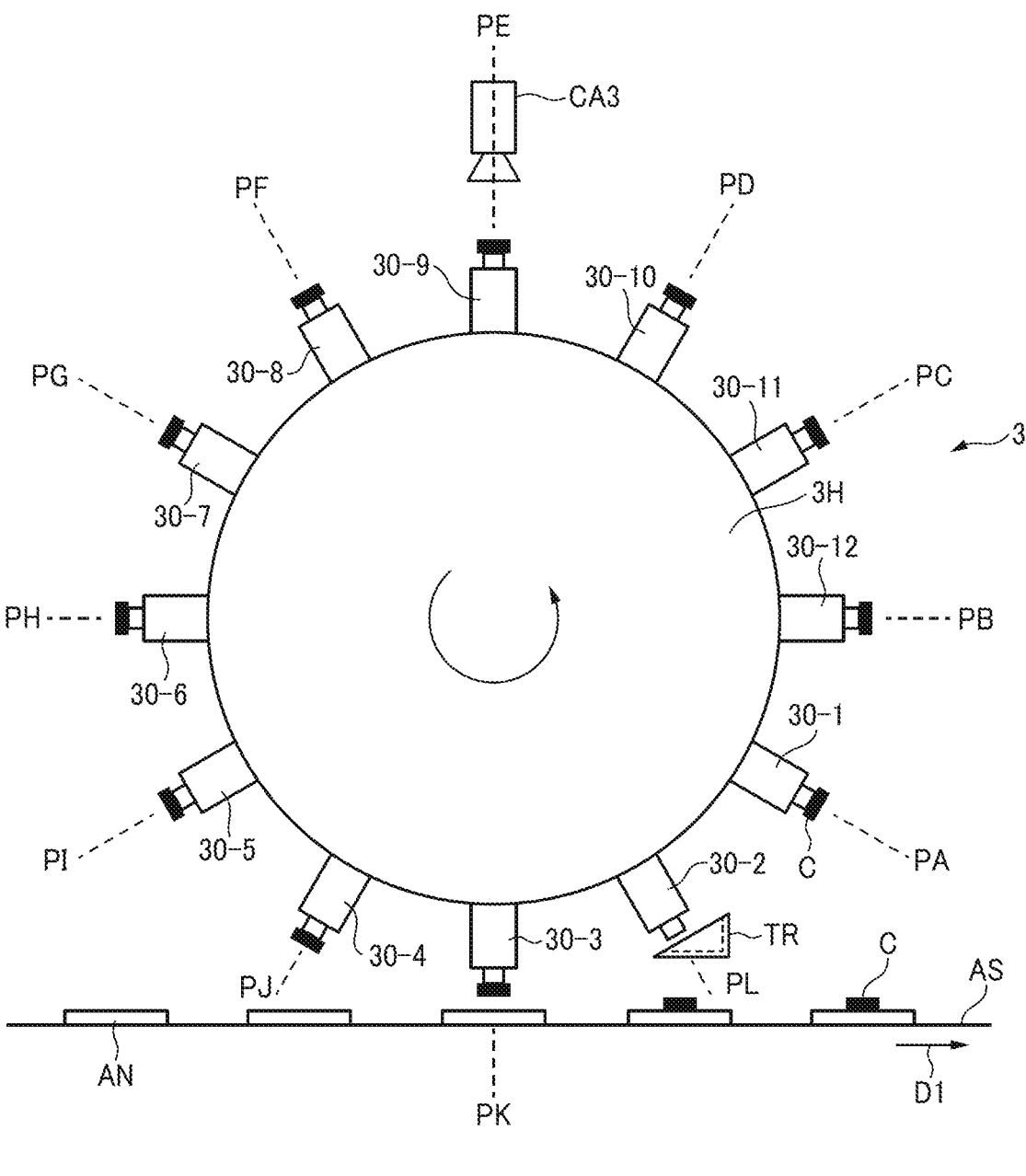
FIG. 7 schematically illustrates a relation between the rotary mounter and the antenna sheet.

Referring to FIG. 7, the rotary head 3H is rotated by a rotation drive motor (not illustrated). Thereby, a circumferential positon of each nozzle unit in the rotary head 3H is sequentially changed. That is, a nozzle unit 30 moves on a surface orthogonal to the conveying surface along a circular track, in response to rotation of the rotary head 3H, and as such, the nozzle unit 30 is sequentially located at each of twelve circumferential positions PA to PL in the rotary head 3H. The positions PA to PL are arranged from the position PA to the position PL in a counter-clockwise direction.

Herein, the position PA (an example of a first position) is a position where the nozzle unit 30 sucks a new IC chip "C" from the chip-containing tape CT. The position PE is a position where the image capture device CA3 images the IC chip "C" in the state of being sucked by the nozzle of the nozzle unit 30.

The position PK (an example of a second position) is a position where the sucked IC chip "C" is released on the conductive paste applied to the antenna AN of the antenna sheet AS that is conveyed. The moving direction of the top of the nozzle matches the conveying direction D1 of the antenna sheet AS at the position PK. The nozzle unit 30 discharges air from the nozzle to release the IC chip "C" at the position PK.

The nozzle unit 30 does not suck the IC chip "C" at the position PL, as it has released the IC chip "C" at the position PK. In order to remove dust that may adhere to the nozzle, air may be jetted out from the nozzle at the position PL. FIG. 6 shows an example of disposing a dust collection tray TR for collecting dust that may be detached from the nozzle, at the position PL.

In an example, the following movement is repeated. In FIG. 7, the nozzle unit 30-1 at the position PA sucks a new IC chip "C" thereat and rotates in the counterclockwise direction while sucking the IC chip "C", and it then releases the IC chip "C" upon reaching the position PK and returns to the position PA to suck a new IC chip "C" again. Such an IC chip mounting method enables continuously placing the IC chip on each antenna AN without stopping conveyance of the antenna sheet AS, resulting in high productivity.

The angular velocity of the rotary head 3H and the conveying speed of the antenna sheet AS are set or controlled so that the nozzle unit 30, which sequentially reaches the position PK, will release the IC chip "C" to the reference position Pref of each antenna AN of the antenna sheet AS, which is conveyed from the upstream side. In order to accurately place the IC chip "C", it is preferable to provide a section where the speed of the top of the nozzle unit 30 is equal to the conveying speed of the antenna sheet AS, in proximity to the position PK.

Note that this embodiment shows an example of arranging twelve nozzle units 30 to the rotary head 3H, but the number of the nozzle units 30 is not limited thereto. The number of the nozzle units 30 that are arranged to the rotary head 3H can be set to any number.

Next, movement of the nozzle unit 30 sucking the IC chip "C" will be described with reference to FIGS. 8 and 9.

Figure 8:
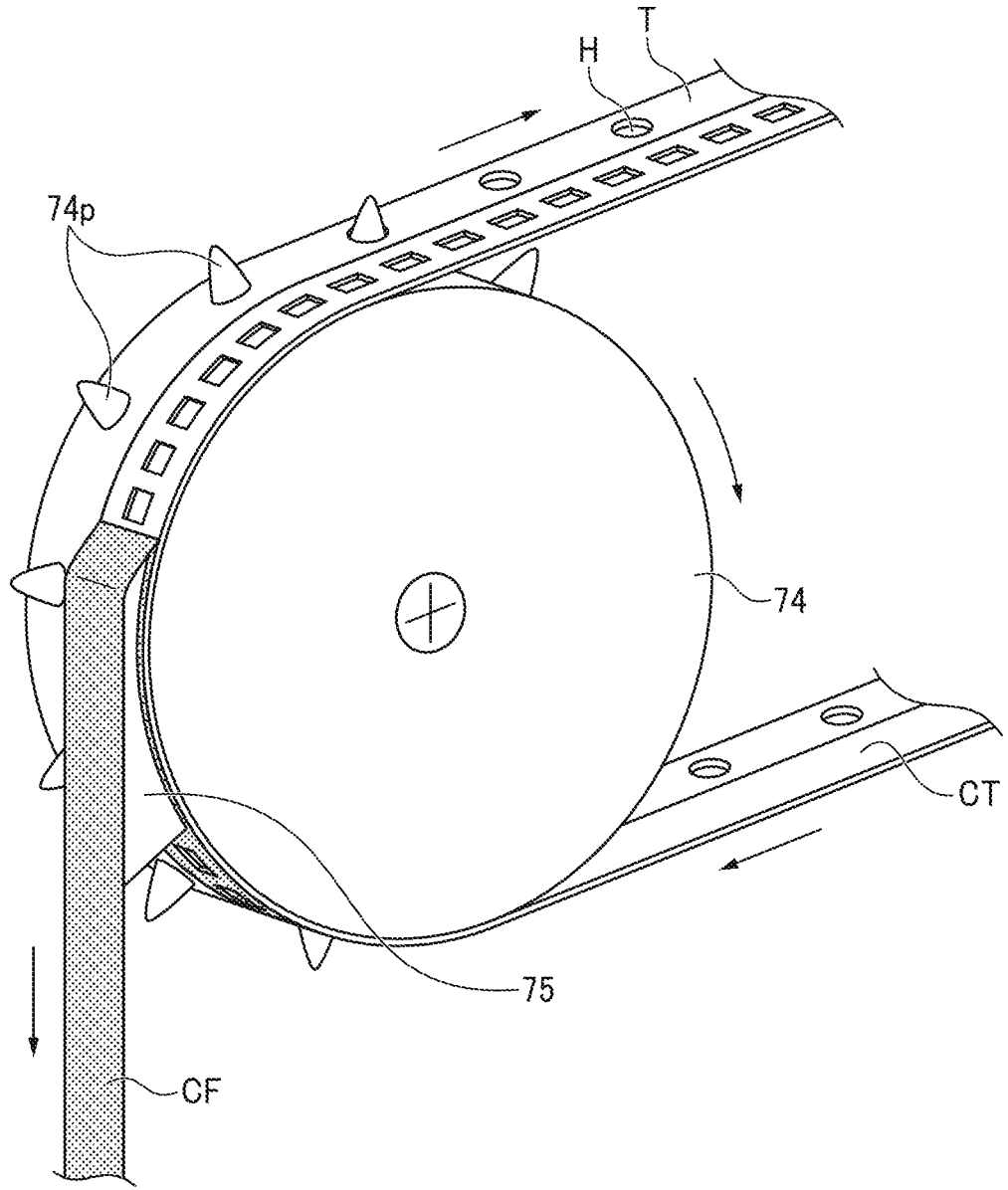
FIG. 8 is a perspective view showing separation of the chip-containing tape by a separation roller.

FIG. 8 is a perspective view showing separation of the chip-containing tape CT by the separation roller 74. FIG. 9 is a side view of the vicinity of the separation roller 74, illustrating movement of supplying the IC chip "C" to the nozzle unit 30 from the chip-containing tape CT. In order to show the state of the chip-containing tape CT, only the chip-containing tape CT is illustrated in cross-section in FIG. 9.

As shown in FIG. 8, the chip-containing tape CT, which is supplied from the tape feeder 71, is conveyed while its position in the width direction is determined by inserting the protrusions 74$p$ of the separation roller 74 into the fitting holes H of the chip-containing tape CT. At this time, the cover film CF is peeled off from the chip-containing tape CT by a split member 75 and is sent to the film winding reel 73. On the other hand, the tape body "T" of the chip-containing tape CT is sent to the tape body winding reel 72.

Figure 9:
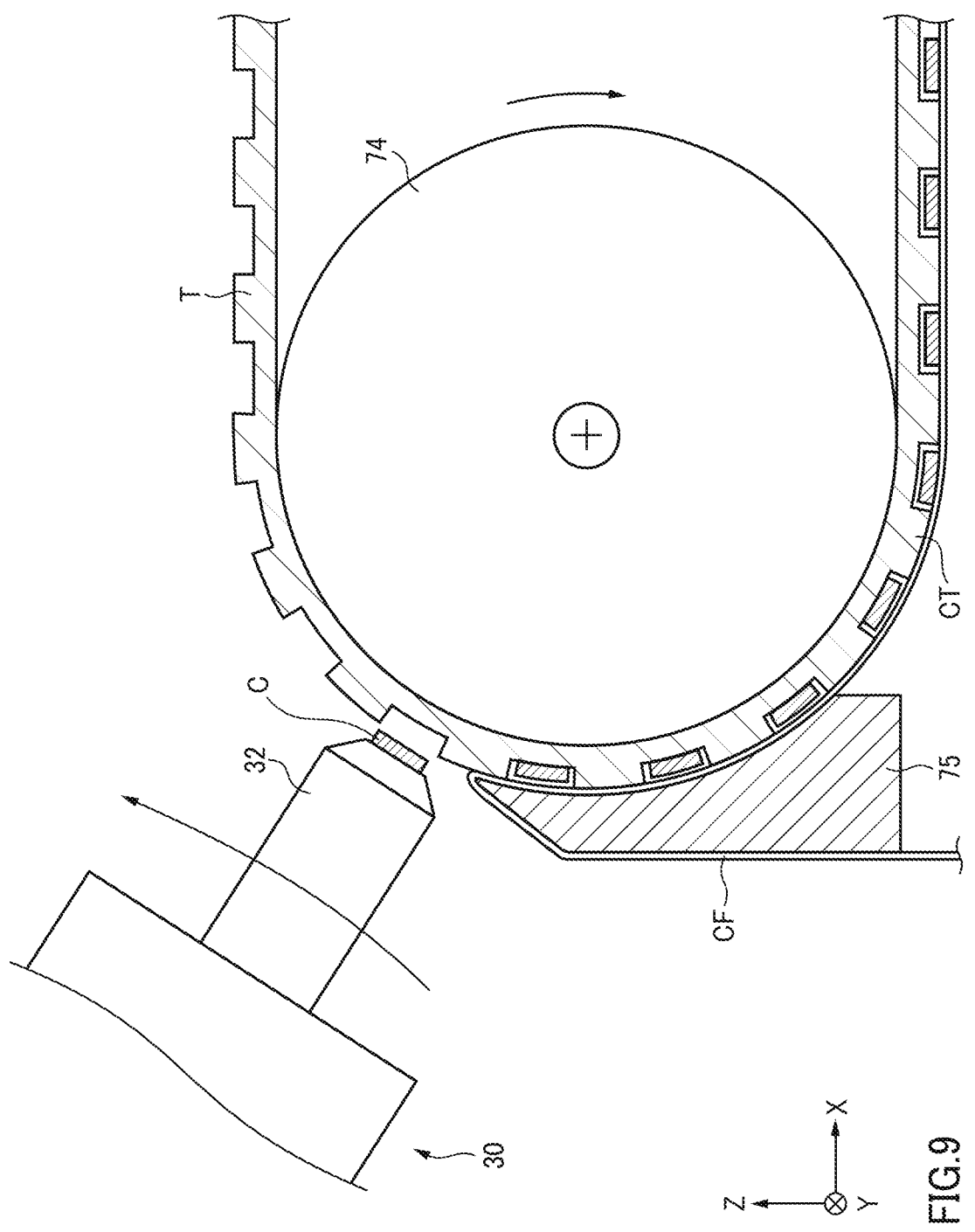
FIG. 9 illustrates movement of supplying an IC chip to a nozzle unit from the chip-containing tape.

As shown in FIG. 9, the IC chip "C" that is exposed due to peeling off of the cover film CF is immediately sucked by the nozzle unit 30. The separation roller 74 is provided with a suction path (not shown) for sucking the IC chip "C" toward the rotation center of the separation roller 74, so that the IC chip "C" will not fall out during a short period from a time when the IC chip "C" is exposed until it is sucked by the nozzle unit 30. The IC chip "C" is sucked through this suction path and the suction hole Ts (refer to FIG. 4) provided to the tape body "T".

Figure 10:
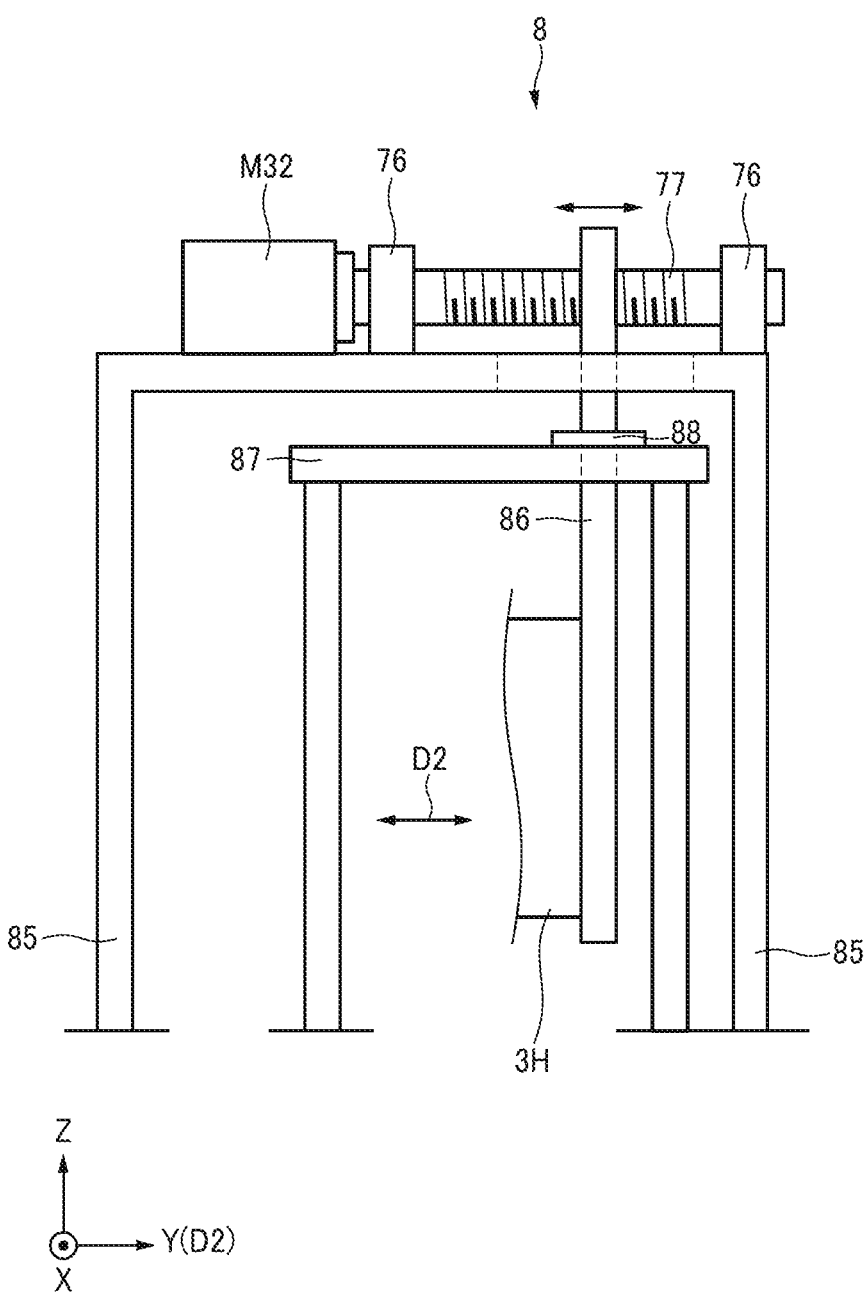
FIG. 10 is a front view of a moving machine in a width direction of the rotary mounter.

A moving machine 8 will be now described with reference to FIG. 10. The moving machine 8 is configured to move the rotary head 3H in the width direction D2. FIG. 10 is a front view of the moving machine 8.

The moving machine 8 is provided to be able to correct a position of the IC chip "C", which has been sucked by the nozzle unit 30, in the width direction D2. As illustrated in FIG. 10, the moving machine 8 is comprised of a bearing 76, a shaft 77, a suspension plate 86, a guide plate 87, a slider 88, and a width-direction drive motor M32.

The bearing 76, the shaft 77, and the width-direction drive motor M32 are provided on the support stand 85. The shaft 77 is a bar-shaped member having a threaded part, and rotationally driven by the width-direction drive motor M32. The shaft 77 is rotatably supported by the bearings 76 (at two locations) fixed on an upper surface of the support stand 85.

The rotary head 3H is attached to the suspension plate 86. A threaded hole (not illustrated) is formed at a top edge portion of the suspension plate 86. The hole is fit to the threaded part of the shaft 77. Thus, in response to rotation of the shaft 7, the suspension plate 86 and the rotary head 3H, which is attached to the suspension plate 86, are movable in the width direction D2. An upper portion of the support stand 85 and the guide plate 87 include hollow parts formed in a movable range of the suspension plate 86 in the width direction D2. The slider 88 is attached to the suspension plate 86, and slides on an upper surface of the guide plate 87, in accordance with movement of the suspension plate 86 in the width direction D2.

With the arrangement described above, the moving machine 8 enables the rotary head 3H to move in the width direction D2, in response to rotational drive by the width-direction drive motor M32.

In the present embodiment, the moving machine 8 moves the rotary head 3H in the width direction D2, thereby moving the nozzle unit 30 attached to the rotary head 3H in the width direction D2; however, other moving machine may be applied. For example, a moving machine may be applied that is able to individually translate, in the width direction D2, each nozzle unit 30 of the rotary head internally, without the rotary head moved in the width direction D2.

With reference to FIG. 3 again, the ultraviolet irradiator 41 is provided in the vicinity of the position (position PK in FIG. 7) where the IC chip is released to the antenna AN from the nozzle unit 30 of the rotary mounter 3.

The ultraviolet irradiator 41 emits ultraviolet light to the conductive paste on the antenna AN that is conveyed. The purpose of emission of ultraviolet light by the ultraviolet irradiator 41 is to adjust viscosity of the conductive paste on the antenna AN, which is different from the purpose of emission of ultraviolet light performed in a curing process (described later) following the IC chip placement process. From this point of view, an integrated light amount of ultraviolet light applied to the conductive paste by the ultraviolet irradiator 41 is preferably less than that of ultraviolet light applied to the conductive paste in the subsequent curing process. An integrated light amount of ultraviolet light is represented by a product of light intensity and irradiation time duration. Thus, adjustment of either light intensity or irradiation time duration enables adjustment of the integrated light amount.

In the IC chip mounting apparatus 1 of the present embodiment, the dispenser 2 may apply a thermosetting adhesive such as epoxy resin to the antenna AN, and a thermosetting machine may be applied in replacement of the ultraviolet irradiator 41.

In FIG. 3, the ultraviolet irradiator 41 is disposed to irradiate the adhesive with ultraviolet light after the IC chip has been located; however, other irradiation methods may be applied. For example, the ultraviolet irradiator 41 may be disposed so as to irradiate the adhesive with ultraviolet light before the IC chip is located, and may be disposed so as to irradiate the adhesive with ultraviolet light concurrently with the IC chip being located.

In case in which the adhesive is irradiated with ultraviolet light after the IC chip has been located, the IC chip is unlikely to shift or tilt after the IC chip has been located, as viscosity of the conductive paste decreases. In case in which the adhesive is irradiated with ultraviolet light before the IC chip is located or concurrently with the IC chip being located, the IC chip is located on the conductive paste with low viscosity. As the IC chip is unlikely to move after having been located on the conductive paste, the IC chip is unlikely to shift or tilt.

In any case, irradiation of ultraviolet light in the vicinity of a place where the IC chip is located, prevents a situation that the IC chip is unstable on the conductive paste due to viscosity of the conductive paste. That is, irradiation of the ultraviolet irradiator 41 has advantage that mounting accuracy of the IC chip is improved.

Figure 11:
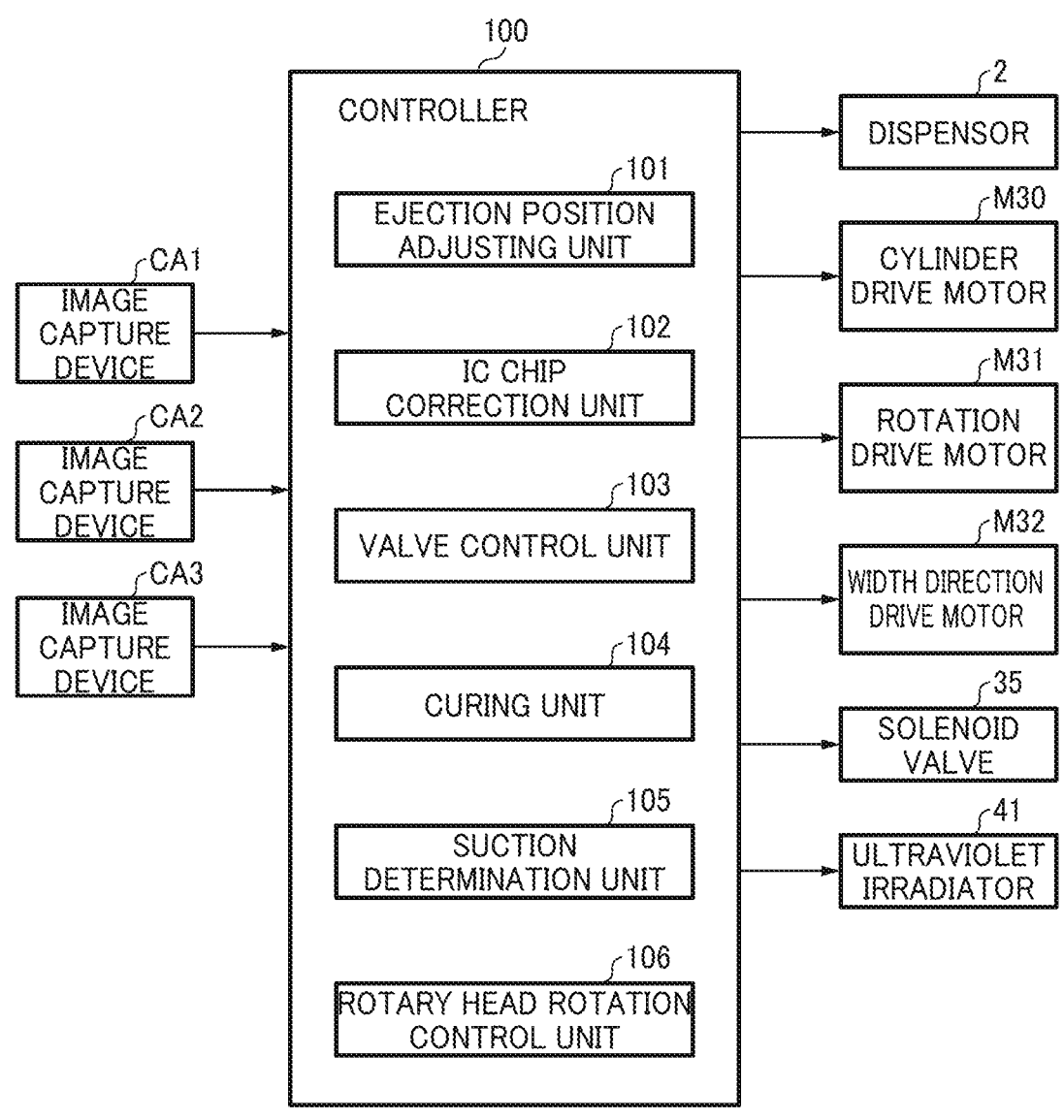
FIG. 11 is a functional block diagram of a controller for controlling the rotary mounter.
Figure 12:
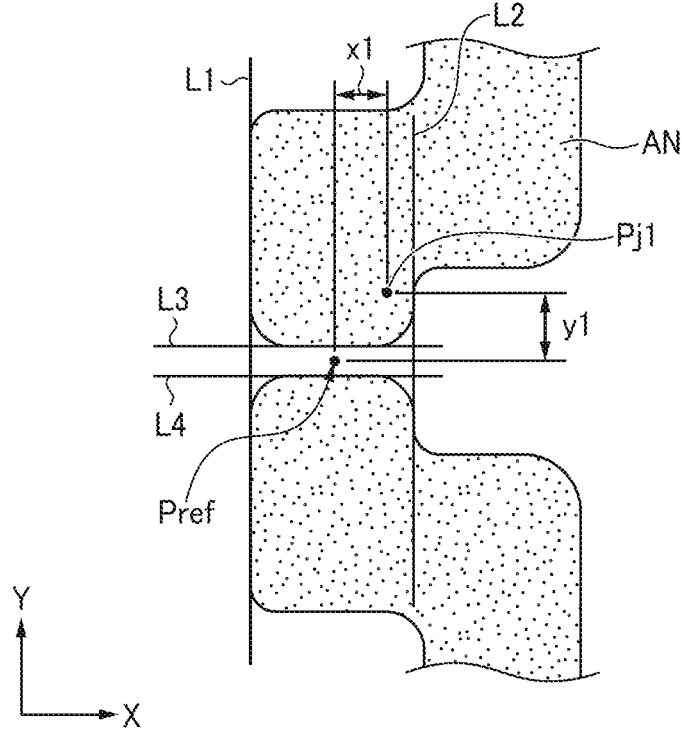
FIG. 12 shows an example of an image captured by an image capture device.
Figure 13:
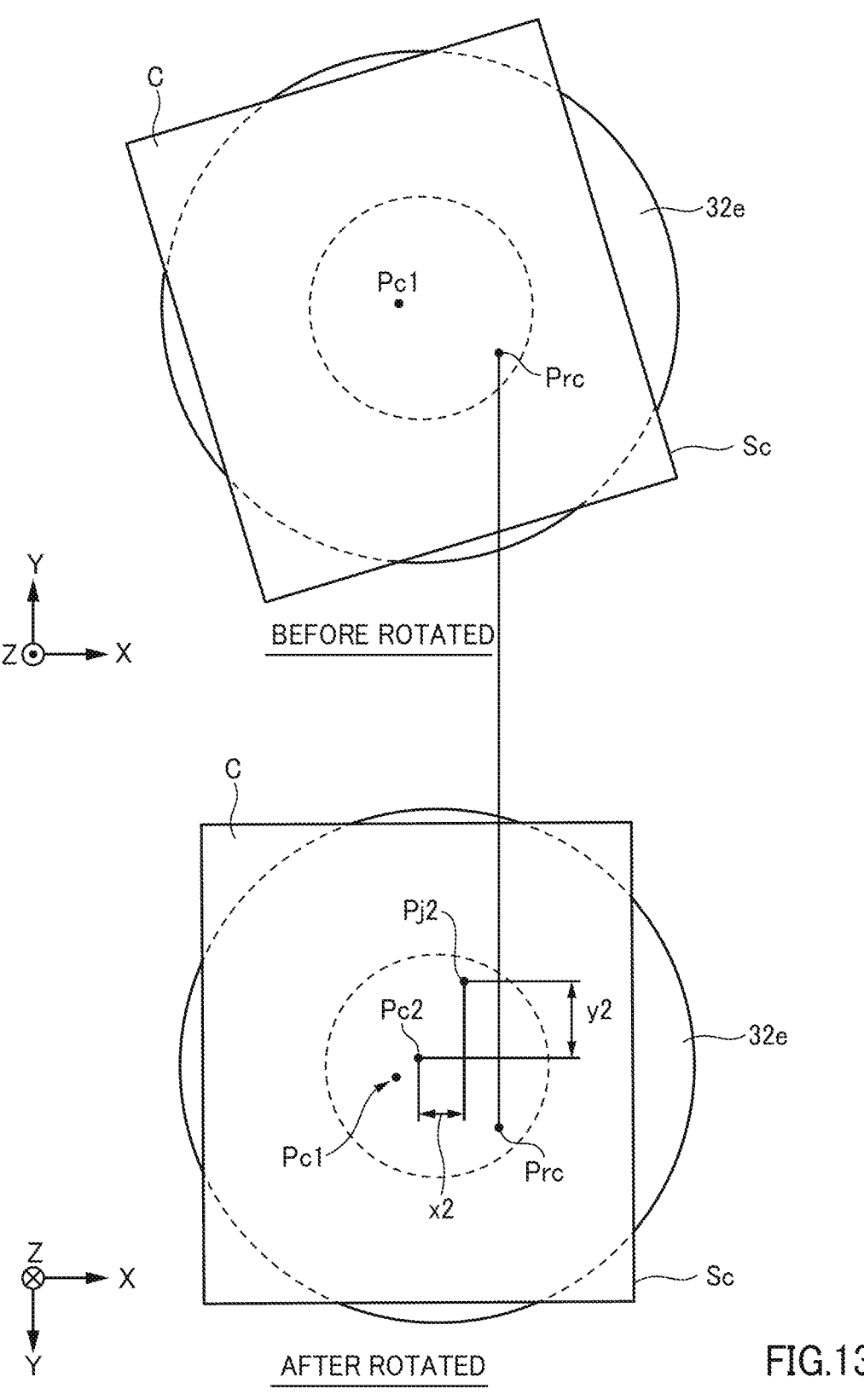
FIG. 13 shows examples of an IC chip sucked by a nozzle before and after the nozzle is rotated.

Next, a control of a control unit 100 for controlling the rotary mounter 3 will be described with reference to FIGS. 11 to 13. FIG. 11 is a functional block diagram of the control unit 100. FIG. 12 illustrates an exemplary image captured by the image capture device CA1. FIG. 13 illustrates exemplary IC chips sucked by the nozzle 32 before and after the nozzle 32 is rotated. FIG. 13 shows an exemplary image captured by the image capture device CA3 in a condition before the nozzle 32 is rotated. FIG. 13, in a condition after the nozzle 32 is rotated, includes an XYZ-axis when the nozzle is at the position PK (see FIG. 7).

The control unit 100 is implemented on a circuit board (not illustrated), and connected to the image capture devices CA1 to CA3, the dispenser 2, the cylinder drive motor M30, a rotational drive motor M31, the width-direction drive motor M32, the solenoid valve 35, and the ultraviolet irradiator 41. The rotational drive motor M31 (an example of a rotating unit) is a drive means for rotating the nozzle units 30-1 to 30-12 in the nozzle head 3H.

The control unit 100 is comprised of a microcomputer, memories (a random access memory (RAM) and a read only memory (ROM)), a storage, and drive circuits. The microcomputer reads out a program stored in the memory to function as each of an ejection position adjusting unit 101, an IC chip correction unit 102, a valve control unit 103, a curing unit 104, a suction determination unit 105, and a rotary head rotation control unit 106.

The ejection position adjusting unit 101 includes a function for determining an ejection position of the conductive paste based on an image captured by the image capture device CA1, and for adjusting an ejection time when the conductive paste is ejected and a positon of the dispenser 2 in the width direction D2. A determination method of a positon where the conductive paste is ejected, will be described with reference to FIG. 12.

As exemplified by FIG. 12, an image captured by the image capture device CA1 is one in the vicinity of the reference position Pref of the antenna AN.

The ejection position adjusting unit 101 identifies the reference position Pref from geometric characters in the image. More specifically, the ejection position adjusting unit 101 analyzes a shape of the antenna AN in the image of FIG. 12 to determine reference lines L1, L2 parallel to each other in the X-direction and reference lines L3, L4 parallel to each other in the Y-direction. The ejection position adjusting unit 101 then identifies the reference position Pref as an intersecting point between a centerline of the reference lines L1, L2 and a centerline of the reference lines L3, L4.

A point Pj1 in the image of FIG. 12, which is a target position for the reference position Pref in the image, is predetermined based on a result of calibration performed with an image captured by the image capture device CA1 and a drop position of the conductive paste by the dispenser 2. That is, an ejection time of the dispenser 2 and a positon of the dispenser 2 in the width direction D2 are adjusted so that the reference position Pref identified in the image matches the target position Pj1, which allows the conductive paste to be applied on the actual reference position of the antenna AN.

In the example of FIG. 12, the reference position Pref identified in the image needs to be adjusted by "x1" in the X-direction and by y1 in the Y-direction, in order to match the target position Pj1. Specifically, an ejection time of the dispenser 2 is determined based on "x1" in consideration of speed for conveying the antenna AN, and the dispenser 2 is translated based on y1 in the width direction D2. That is, the ejection position adjusting unit 101 transmits a control signal to the dispenser 2 for instructing the an ejection time and translational displacement in the width direction D2, and the dispenser 2 then perform an ejection operation based on the control signal.

An image captured by the image capture device CA2 is similar to one in FIG. 12, except that the conductive paste is applied.

The IC chip correction unit 102 (an example of a correction amount determination unit) includes a function for correcting a position of the IC chip sucked by the nozzle 32. The correction method of the position of the IC chip will be described with reference to FIGS. 12 and 13.

As illustrated in FIG. 13 in a condition before the nozzle 32 is rotated, the image captured by the image capture device CA3 (an example of an image acquisition unit) includes a nozzle end 32e and an IC chip sucked by the nozzle end 32e. A point Pc1 is a central position of the IC chip before the nozzle is rotated. A Pj2 in the image of FIG. 13 is a target position for the central position of the IC chip.

The Pj2 is set so as to match the target position Pj1 in FIG. 12. That is, the central position of the IC chip is caused to match the target position Pj1, which allows the IC chip "C" to be placed at the reference position of the antenna AN that is actually conveyed.

A rotational center Prc around the axis of the nozzle 32 is unlikely to be a theoretical axial center of each nozzle due to attachment variation etc. of the nozzle units 30-1 to 30-12. The rotational center Prc may be different for each nozzle unit, and is determined based on measurement data which is obtained beforehand.

First, the central position Pc1 of the IC chip "C" in the image is rotated about the rotational center Prc of the nozzle 32, and a rotation amount is then determined when a reference line of the IC chip "C" (for example, a reference side Sc of the IC chip "C" in FIG. 13) becomes parallel to the Y-direction.

In the example of FIG. 13 in a condition after the nozzle 32 is rotated, the IC chip "C" in the captured image is rotated about the rotational center Prc so that the reference side Sc of the IC chip "C" becomes parallel to the Y-direction. A rotation angle is then determined as a correction amount in a rotational direction of the IC chip "C" (an example of a first correction amount). Here, a central position of the IC chip "C" after being moved is defined as a point Pc2. Then, "x2" and "x3" are determined so that the point Pc2 matches the target position Pj2. "x2" is a correction amount x2 in the X-direction (an example of a second correction amount). "x3" is a correction amount y2 in the Y-direction (an example of a third correction amount).

The IC chip correction unit 102 transmits a control signal to the cylinder drive motor M30. The control signal corresponds to the correction amount in the rotational direction about the axis of the nozzle 32. The nozzle 32 is then rotated about the axis thereof, while moved from the position PE where the image of the nozzle 32 is captured by the image capture device CA3, to the position PK where the IC chip is released.

The IC chip correction unit 102 transmits a control signal to the rotational drive motor M31. The control signal corresponds to the correction amount x2 in the X-direction. An angular velocity of the rotary head 3H is then adjusted. The IC chip correction unit 102 transmits a control signal to the width-direction drive motor M32. The control signal corresponds to the correction amount y2 in the Y-direction. A position of the rotary head 3H in the width direction D2 is then adjusted. As the position of the rotary head 3H in the width direction D2 is adjusted, the position of the nozzle 32 in the width direction D2 is also adjusted.

In the IC chip mounting apparatus 1 of the present embodiment, the IC chip correction unit 102 performs corrections for positions of the IC chip in the X-direction, the Y-direction, and orientation of the IC chip in a plane orthogonal to the axis of the nozzle. Thereby, the IC chip mounting apparatus 1 exerts a beneficial effect that mounting accuracy of the IC chip to the antenna is very high.

The valve control unit 103 controls each solenoid valve 35 of the twelve nozzle units 30-1 to 30-12 of the rotary mounter 3, so that each nozzle unit 30 either sucks or discharges air, depending on a position of each nozzle unit 30. More specifically, the valve control unit 103 controls the solenoid valve 35, so that the nozzle unit 30 sucks when located at any position of the positions PA to PJ (see FIG. 7) while the nozzle unit 30 discharges air when located at the position PK or the position PL.

The curing unit 104 transmits a drive signal to the ultraviolet irradiator 41, so that the ultraviolet irradiator 41 emits ultraviolet light to each antenna AN that is conveyed, with predetermined integrated light amount.

The suction determination unit 105 determines whether each nozzle unit 30 sucks an IC chip while each nozzle unit 30 moves form the position PA to the position PK. The position PA is a position where each nozzle unit 30 starts sucking an IC chip. The position PK is a position where each nozzle unit 30 releases an IC chip. In an example of the present embodiment, the suction determination unit 105 determines whether each nozzle unit 30, which sequentially reaches the position PE, is sucking an IC chip, based on an image captured by the image capture device CA3 (an example of an image acquisition unit).

The rotary head rotation control unit 106 controls an angular velocity in rotating the rotary head 3H, so that a nozzle unit 30 that reaches the position PK (an example of a second position) later than a non-sucking nozzle unit, releases an IC chip to an antenna corresponding to the non-sucking nozzle unit. The non-sucking nozzle unit is a nozzle unit 30 that has been determined as not sucking an IC chip.

Figure 14:
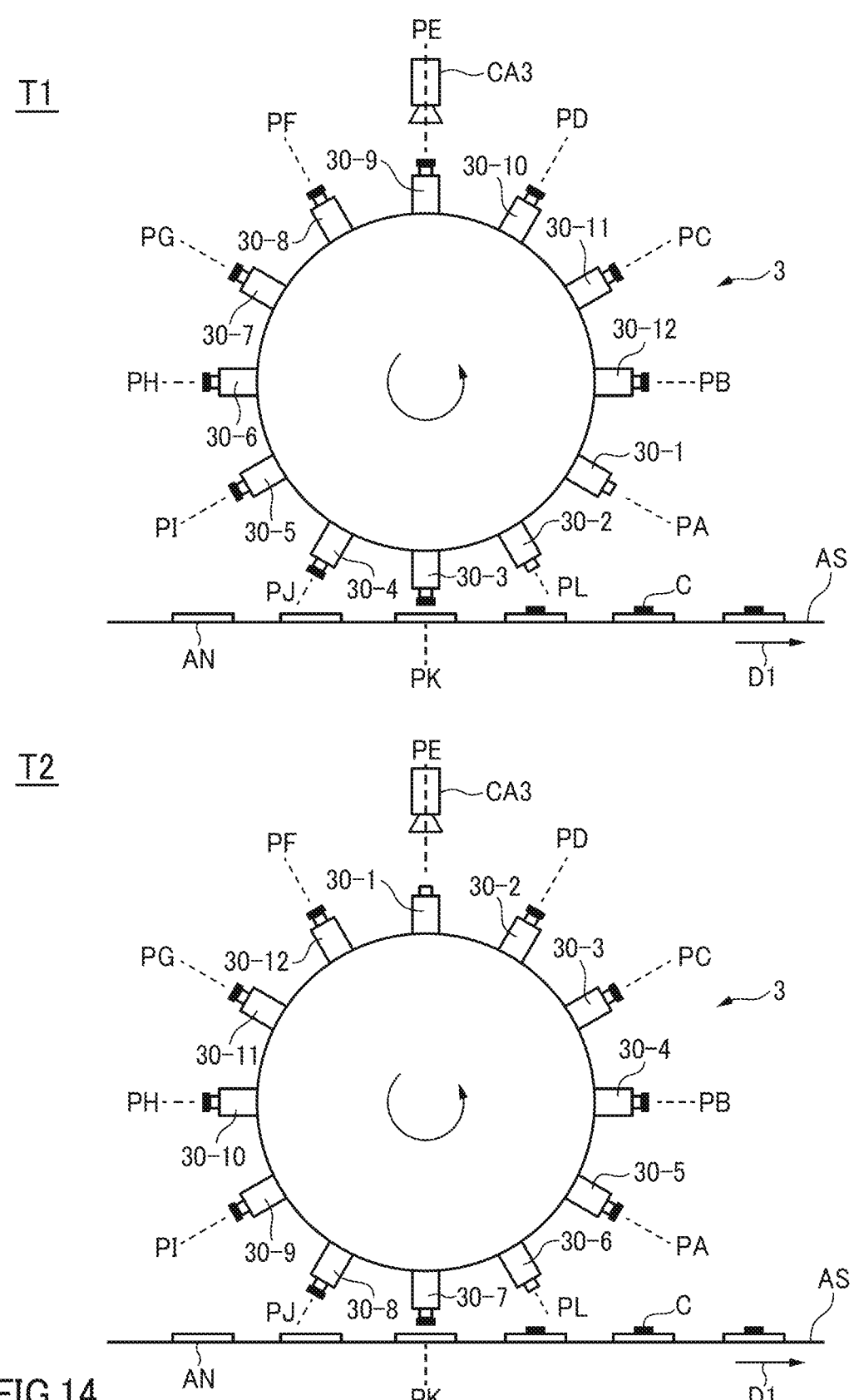
FIG. 14 shows an operation of the rotary mounter.
Figure 15:
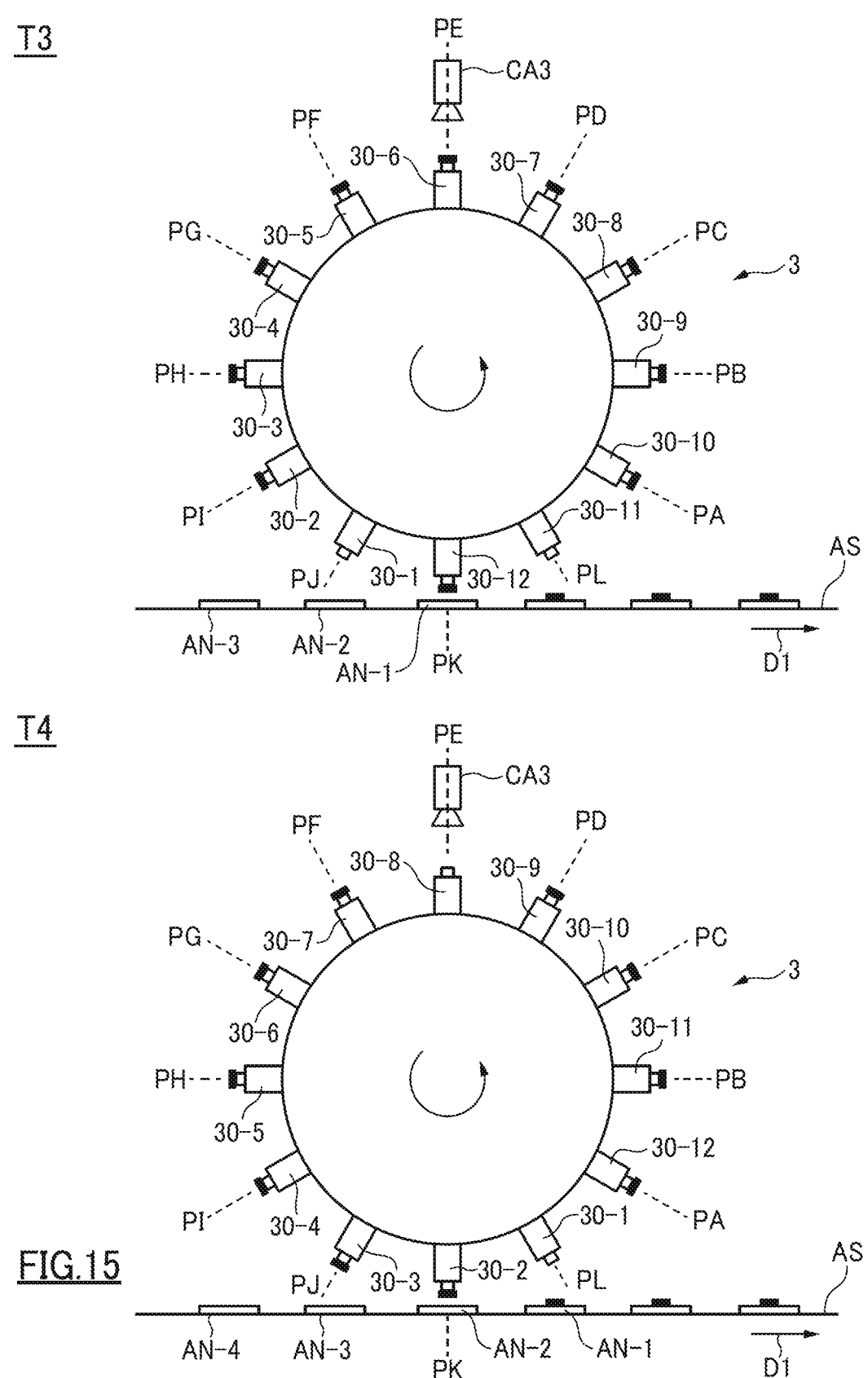
FIG. 15 shows an operation of the rotary mounter.

Regarding the rotary head rotation control unit 106, an operation will now be explained with reference to FIGS. 14 and 15 when the rotary mounter 3 fails to suck an IC chip "C". FIGS. 14 and 15 each illustrates an overview of a relation between the rotary mounter 3 and the antenna sheet AS to explain the operation when the rotary mounter 3 fails to suck an IC chip "C". FIGS. 14 and 15 represents statuses of the rotary mounter 3 as time elapses from T1 to T4.

It is assumed that the nozzle unit 30-1 at the position PA fails to suck an IC chip "C" at the time T1 in FIG. 14. That is, the nozzle unit 30-1 corresponds to a non-sucking nozzle unit.

The nozzle unit 30-1 rotates counterclockwise to reach the position PE at the time T2 in FIG. 14. At this time, an image of the nozzle 32 of the nozzle unit 30-1 is captured by the image capture device CA3, and the nozzle unit 30-1 is then determined as a non-sucking nozzle unit.

The nozzle unit 30-1 as a non-sucking nozzle unit reaches the position PJ at the time T3 in FIG. 15. As shown, an antenna that corresponds to the nozzle unit 30-1 is an antenna AN-2 on the antenna sheet AS. That is, if the nozzle unit 30-1 was sucking an IC chip, the IC chip would be released to the antenna AN-2.

The IC chip is released at the time T4 in FIG. 15. At this time, the an angular velocity of the rotary head 3H in the rotary mounter 3 is controlled so that the IC chip is released to the antenna AN-2 that corresponds to the nozzle unit 30-1 as a non-sucking nozzle unit. That is, the rotary head 3H in the rotary mounter 3 is rotationally accelerated so that other nozzle unit following the nozzle unit 30-1 releases an IC chip to the antenna AN. Consequently, at the time T4, the nozzle unit 30-2 releases an IC chip to the antenna AN-2. Here, the nozzle unit 30-2 is a nozzle unit that immediately follows the nozzle unit 30-1 (that is, a nozzle unit that first reaches the position PK after the nozzle unit 30-1). Thereby, a situation is prevented in which the antenna AN-2 without an IC chip placed thereon is conveyed to the subsequent process, and a yield rate is therefore improved.

It should be noted that a nozzle unit that releases an IC chip to the antenna AN-2 is not limited to the nozzle unit 30-2. Other nozzle unit (e.g. the nozzle unit 30-3) that follows the nozzle unit 30-1 may release an IC chip to the antenna AN-2.

In a case in which the operation shown in FIGS. 14 and 15 is performed, the rotary head rotation control unit 106 accelerates the rotary head 3H when an non-sucking nozzle unit comes close to the position PK. The rotary head rotation control unit 106 further controls the rotation drive motor M31 and the corresponding solenoid valve 35 so that nozzle unit reaching the position PK later than the non-sucking nozzle unit releases an IC chip to an antenna corresponding to the non-sucking nozzle unit.

Preferably, the valve control unit 103 controls the solenoid valve 35 of the non-sucking nozzle unit so that the non-sucking nozzle unit does not perform the suction operation. Thereby, the uncured conductive paste (thus, with high fluidity) on the antenna is prevented from being attached to and thus contaminating the non-sucking nozzle unit.

Preferably, the valve control unit 103 controls the solenoid valve 35 of the non-sucking nozzle unit so that the non-sucking nozzle unit does not perform the discharge operation at the position PK. Thereby, the uncured conductive paste (thus, with high fluidity) at the position PK on the antenna is prevented from being scattered around and thus contaminating the antenna.

(2) Curing Process

Next, the curing process will be described with reference to FIGS. 16 and 17. The curing process involves curing the conductive paste, which is applied to each antenna and undergoes the IC chip placement process, whereby the physical connection between the antenna and the IC chip is strengthened, and the electrical conduction between the antenna and the IC chip is reliably made.

Figure 16:
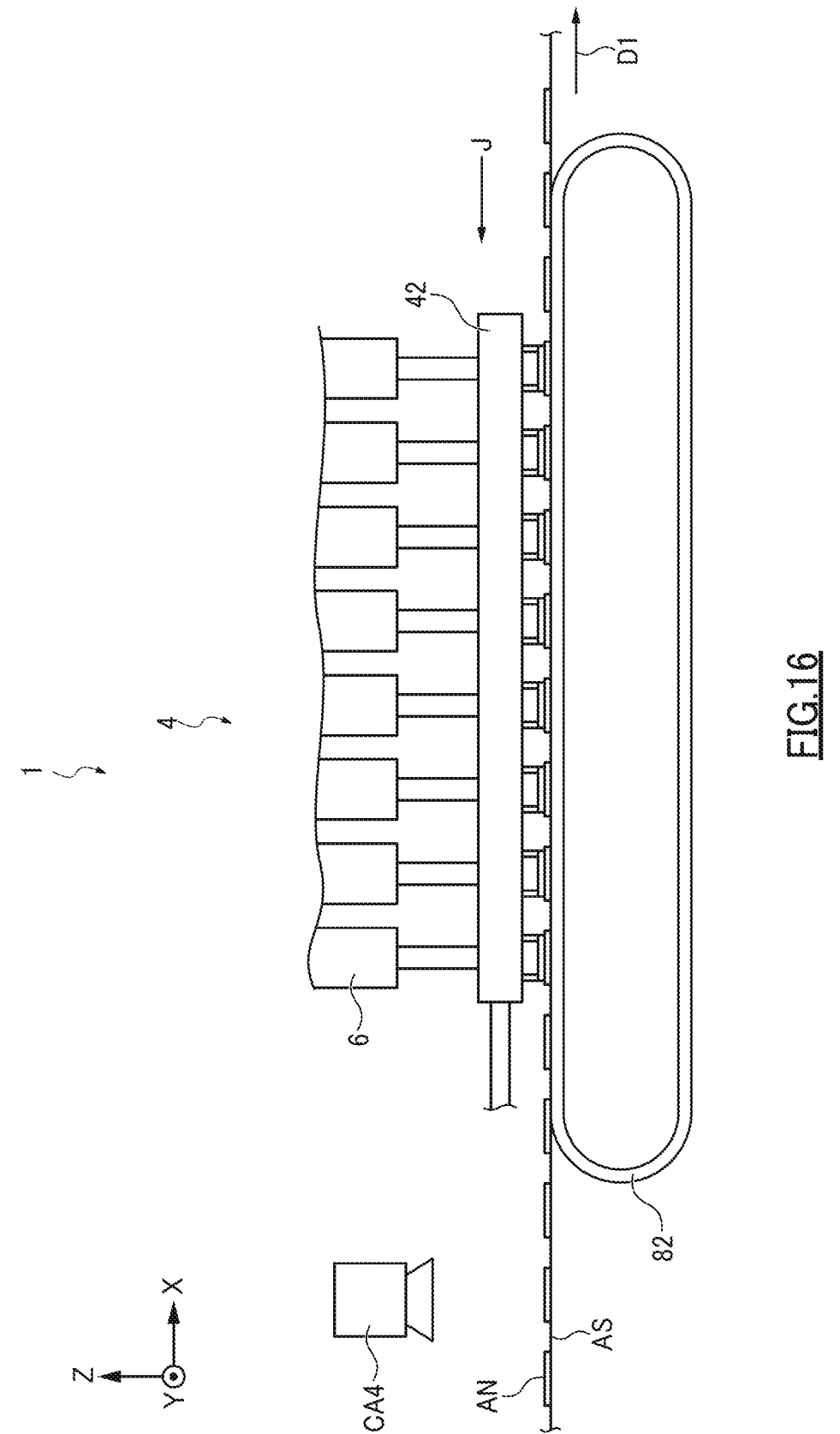
FIG. 16 shows an area corresponding to a curing process of the IC chip mounting apparatus of the embodiment.

FIG. 16 shows an area corresponding to the curing process of the IC chip mounting apparatus 1 of this embodiment. FIG. 17 shows a part of a press unit 6 and ultraviolet irradiators 42 as seen from the arrow "J" in FIG. 16.

As shown in FIG. 16, the IC chip mounting apparatus 1 includes a conveyor 82, a curing device 4, and an image capture device CA4, in the curing process.

The conveyor 82 conveys the antenna sheet AS that is conveyed from the upstream IC chip placement process to a downstream side at a predetermined conveying speed.

The image capture device CA4 is disposed above the antenna sheet AS on the most upstream of the curing process (that is, the most downstream of the IC chip placement process) and captures an image of each antenna AN that is conveyed from the IC chip placement process. The image capture device CA4 is provided in order to inspect whether the IC chip is placed at an appropriate position in the IC chip placement process.

As illustrated in FIG. 16, the curing machine 4 is comprised of one or plural press units 6 and an ultraviolet irradiator 42.

The press unit 6 rises or falls in a direction orthogonal to the conveying surface. The press unit 6 presses the IC chip located on the conductive paste on the antenna AN, while each antenna AN is irradiated with ultraviolet light. A quantity of the press unit 6 is not limited, and may be determined from aspects of productivity and cost.

The ultraviolet irradiator 42 is disposed along the conveying direction D1. Thus, the ultraviolet irradiator 42 is also able to emit ultraviolet light simultaneously to the multiple antennas AN on the antenna sheet AS.

Figure 17:
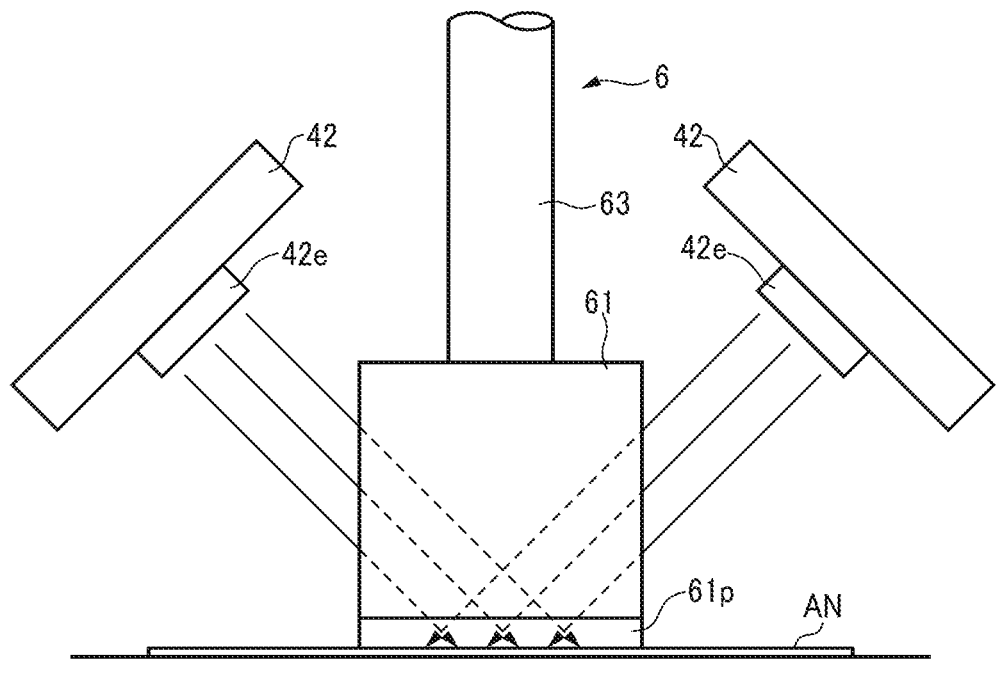
FIG. 17 shows a part of a press unit and an ultraviolet irradiator as seen from the arrow "J" in FIG. 16

Referring to FIG. 17, it is shown that the ultraviolet irradiator 42 irradiates each antenna AN with ultraviolet light. As illustrated in FIG. 15, the press unit 6 has a shaft 63, a tip of which is attached to a pressing part 61. A lateral face of the pressing part 61 of the press unit 6 (that is, a face in the side on which the ultraviolet irradiator 42 is disposed) is open. A glass plate 61*p*, which is a pressing surface of the pressing part 61, is made of glass through which ultraviolet light passes.

The ultraviolet irradiator 42 has a light source 42e such as a light emitting diode (LED). The light source 42e is configured to emit ultraviolet light to the antenna AN from a direction slanted off the conveying surface.

Ultraviolet light irradiation is performed while the IC chip on the conductive paste, which is applied to each antenna AN, is pressed. Thereby, the conductive paste is cured to strengthen physical connection between the antenna and the IC chip, and electrical connection between the antenna and the IC chip is ensured.

As aforementioned, a belt-shaped antenna sheet is on a manufacturing line. The belt-shaped antenna sheet has plural antennas, each of which is formed on a base material with a constant pitch. The IC chip is mounted on each antenna through the IC chip placement process and the curing process. The IC chip mounting apparatus 1 of the present embodiment applies an adhesive to the reference position of the antenna and places an IC chip on the adhesive in the IC chip placement process. The IC chip mounting apparatus 1 then cures the adhesive in the curing process to strengthen connection between the antenna and the IC chip. In the IC chip placement process, an IC chip sucked by the nozzle is sequentially placed at the reference position of the antenna. In the IC chip placement process according to the present embodiment, rotation of the rotary head in the rotary mounter is controlled so that other nozzle unit following a non-sucking nozzle unit releases an IC chip. Thereby, a situation is prevented in which an antenna without an IC chip placed thereon is conveyed to the subsequent process, and a yield rate is therefore improved.

Although an embodiment of the IC chip mounting apparatus and the IC chip mounting method is described above, the present invention should not be limited to the foregoing embodiment. In addition, the embodiment described above may be variously modified and altered within the scope not departing from the gist of the present invention.

In an example, although the antenna sheet AS is conveyed on the conveyor 81 in one direction in the IC chip placement process in the embodiment shown in FIG. 3, the conveying method is not limited thereto.

Figure 18:
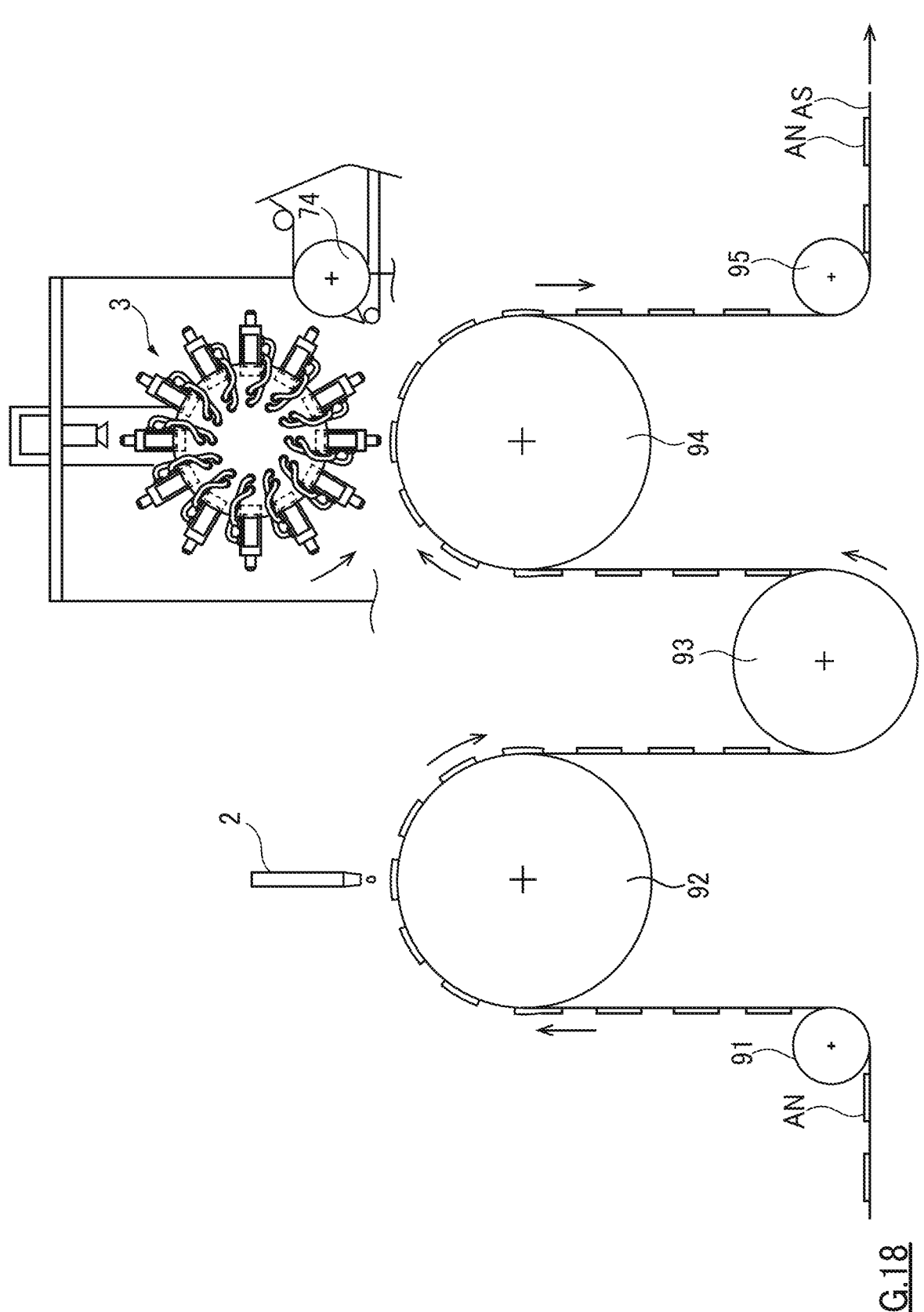
FIG. 18 shows a method of conveying the antenna sheet of an embodiment.

In an embodiment, as shown in FIG. 18, the antenna sheet AS may be conveyed by suction drums 92 and 94 and a plurality of conveying rollers (e.g., conveying rollers 91, 93, and 95 in FIG. 17) in the IC chip placement process. In FIG. 18, the dispenser 2 ejects the conductive paste to the reference position of the antenna AN of the antenna sheet AS, at the highest position of the suction drum 92. In addition, the IC chip is placed on the conductive paste at the highest position of the suction drum 94. In this case, at least the suction drums 92 and 94 are preferably suction rollers that suck the back surface of the antenna sheet AS. This structure prevents dislocation of the antenna sheet AS (in particular, in the longitudinal direction), whereby ejection of the conductive paste as well as placement of the IC chip is performed with high accuracy.

In an embodiment, instead of releasing the IC chip on the conductive paste applied to the antenna AN on the conveyed antenna sheet AS, the IC chip may be placed by pressing it to the conductive paste.

Figure 19:
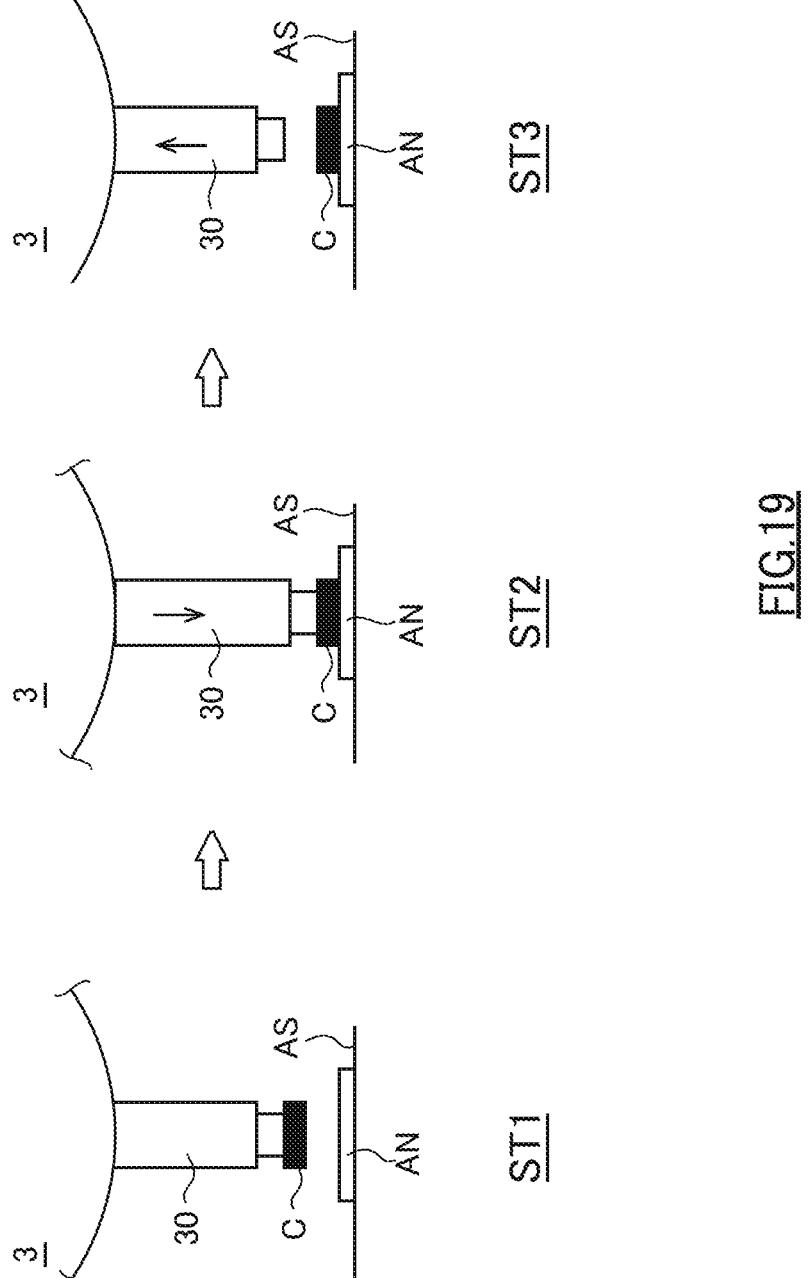
FIG. 19 illustrates the IC chip placement process of an embodiment.

FIG. 19 shows movement of the rotary mounter 3 in time series in the case of placing the IC chip by pressing it to the conductive paste. In an embodiment, nozzle units 30 of the rotary mounter 3 are configured to move in respective radial directions (diameter directions) by a built-in drive device.

The state ST1 is a state in which the nozzle unit 30 sucks the IC chip "C". Placement of the sucked IC chip "C" is performed in the state ST2. That is, the nozzle unit 30 is moved toward the reference position (that is, in the lower direction which is the Z-direction in FIG. 2) in such a manner as to extend in the radial direction (diameter direction). The IC chip "C" is then placed on the conductive paste by pressing it to the conductive paste applied to the antenna AN. After the IC chip "C" is placed, the suction is released, and the nozzle unit 30 is returned to the position in the state ST1. For example, the movement from the state ST1 to the state ST3 is performed at the time the nozzle unit 30 reaches the position PK (refer to FIG. 7), whereby the IC chip "C" is placed on the conductive paste applied on the antenna AN.

Figure 20:
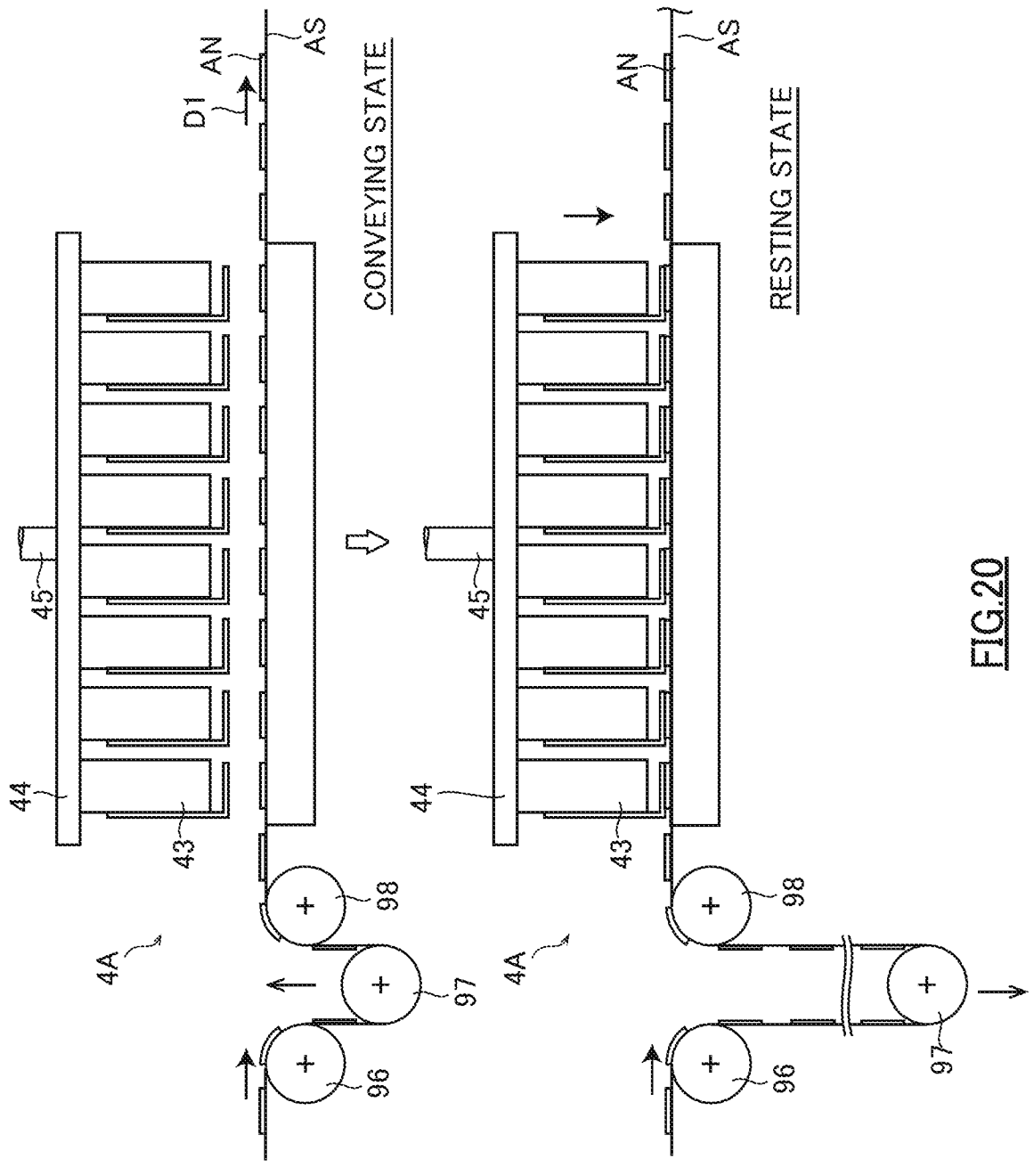
FIG. 20 illustrates the curing process of an embodiment.

A curing process of an embodiment is shown in FIG. 20. FIG. 20 shows a curing device 4A that is used in the curing process of an embodiment. The curing device 4A includes a plurality of ultraviolet curing units 43 that are detachably mounted to a mounting board 44. A plurality of mounting boards 44 that have different mounting positions are prepared in accordance with the interval of adjacent antennas AN of the antenna sheet AS. Under these conditions, the mounting boards 44 are switched in response to the interval, whereby various antenna sheets AS can be used in the curing device 4A.

A support shaft 45 supports and moves the mounting board 44 up and down. The antenna sheet AS that is conveyed from the IC chip placement process is sent to the curing process via conveying rollers 96 to 98. The conveying roller 97 is moved up and down by a drive device (not shown).

Figure 21:
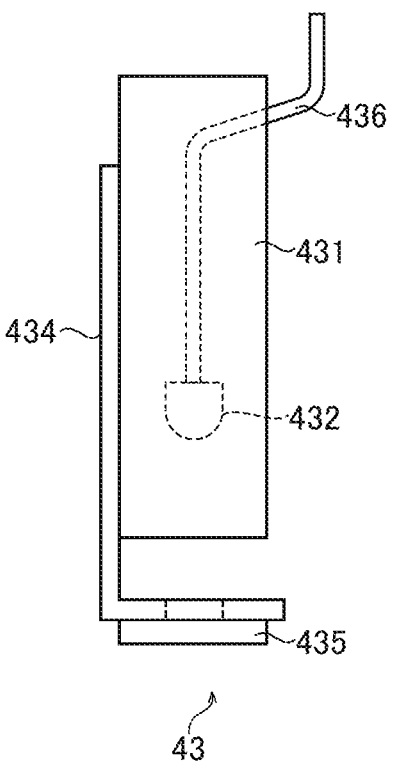
FIG. 21 shows a configuration example of an ultraviolet curing unit in FIG. 20.

An example of the structure of the ultraviolet curing unit 43 is shown in FIG. 21. As shown in FIG. 21, the ultraviolet curing unit 43 contains a light source 432 (e.g., an LED light source) for emitting ultraviolet light, in a housing 431. The light source 432 is powered via a cable 436 (not shown in FIG. 20) that is provided from the outside of the ultraviolet curing unit 43. A condensing lens for condensing ultraviolet light that is emitted by the light source 432 may be provided in the housing 431. A holding plate 434 is coupled to the housing 431 and holds a glass plate 435. The ultraviolet light that is emitted from the light source 432 illuminates and cures the conductive paste applied to each antenna AN.

With reference to FIG. 20 again, the conveying state is a state in which the antenna sheet AS is conveyed from the IC chip placement process. The conveyance of the antenna sheet AS is stopped at the time the antennas AN applied with uncured conductive paste come immediately under the ultraviolet curing units 43. Then, in the state (resting state) in which the conveyance of the antenna sheet AS is rested, the ultraviolet curing units 43 are lowered, and they emit ultraviolet light to cure the conductive paste while pressing the antennas AN with the glass plates 435.

The antenna sheet AS is conveyed from the IC chip placement process during the resting state, and therefore, the conveying roller 97 is lowered by its own weight and absorbs the conveyed antenna sheet AS between the conveying rollers 96 and 98 while ultraviolet light is emitted. After emission of ultraviolet light is finished, the antennas AN, number of which corresponds to the number of the ultraviolet curing units 43, are quickly conveyed to a downstream side, and instead, uncured antennas AN are then stopped at the positions immediately under the ultraviolet curing units 43. That is, in the curing process of an embodiment, the conveying state and the resting state (ultraviolet light emission state) of the antenna sheet AS are repeated. In quickly conveying the antennas AN, the conveying roller 97 is raised by tension applied to the antenna sheet AS.

The curing process of an embodiment may use a thermosetting device. That is, in the case of applying a thermosetting adhesive, such as an epoxy resin, by the dispenser 2, the adhesive is cured by a thermosetting treatment in the curing process.

Figure 22:
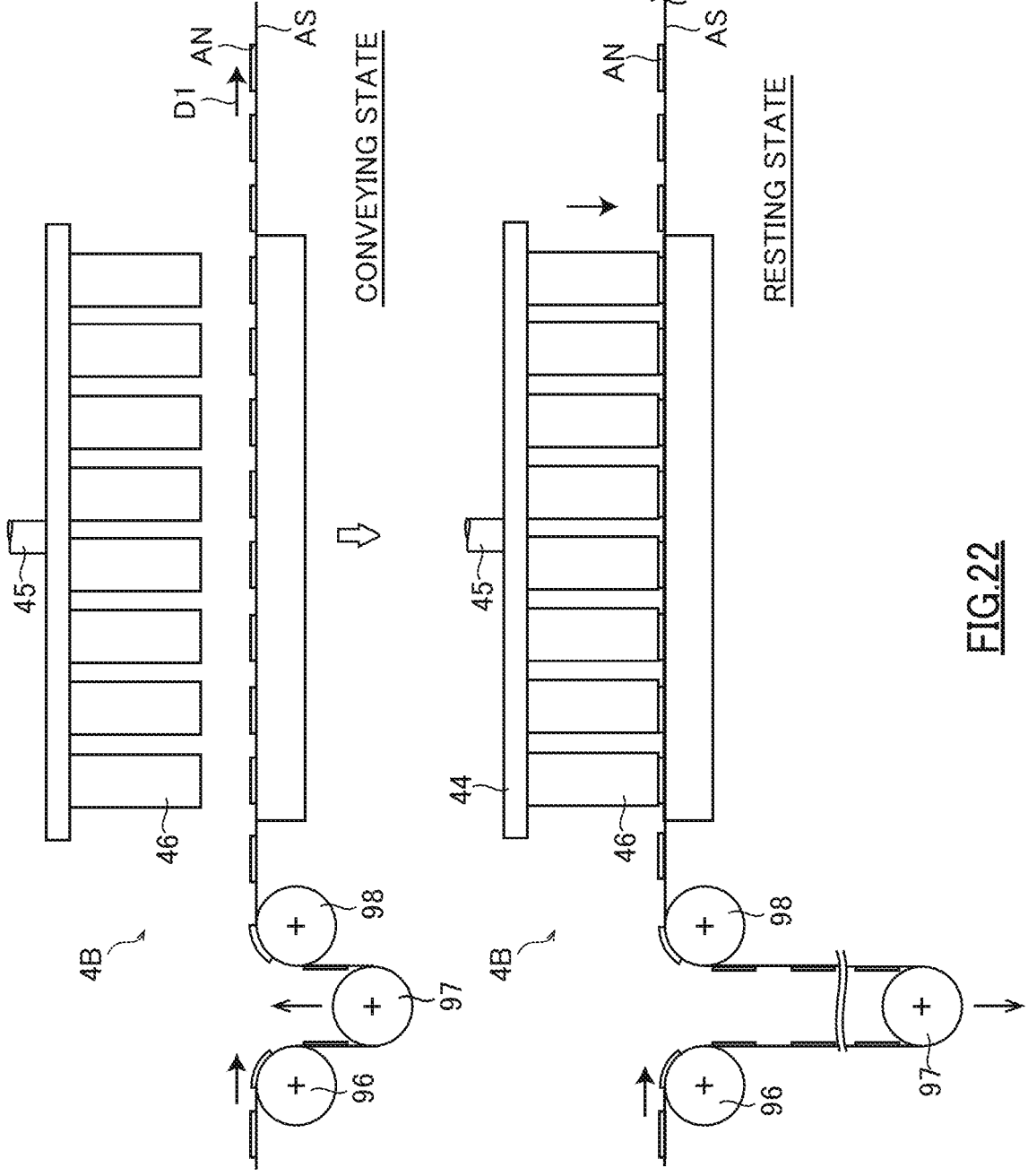
FIG. 22 illustrates the curing process of an embodiment.

FIG. 22 shows a curing device 4B configured so that the conveying state and the resting state of the antenna sheet AS will be repeated as in the case in FIG. 20. The curing device 4B is different from the curing device 4A in having a plurality of thermosetting units 46. A heat source that is operated by power supplied via a cable (not shown) is disposed to each thermosetting unit 46. While the antenna sheet AS is in the resting state, the support shaft 45 is driven so as to move down, and each thermosetting unit 46 heats and cures the adhesive while pressing the corresponding antenna AN. After heating is completed, the support shaft 45 is driven so as to move up, and the antenna sheet AS is conveyed.

In the case of curing the conductive paste with ultraviolet light in FIG. 20, instead of the ultraviolet curing unit 43 containing the light source, a press unit for pressing the antenna AN via a glass plate may be used. In addition, an ultraviolet irradiator may also be provided in such a manner as to emit ultraviolet light from an outside in the width direction or an oblique upper side to the conductive paste on the antenna AN that is pressed in the resting state.

In an embodiment, in order to not make the antenna sheet AS in the resting state during emission of ultraviolet light, the plurality of the ultraviolet curing units 43 may be circulated in a manner linked to the advance speed of the antenna sheet AS, and ultraviolet light may be emitted by the internal light source while the antenna AN is pressed.

Similarly, in an embodiment, in thermally curing the conductive paste, the plurality of the thermosetting units 46 may be circulated in a manner linked to the advance speed of the antenna sheet AS, and the antenna AN may be heated while being pressed.

The invention claimed is:

1. An IC chip mounting apparatus comprising:

an ejection unit configured to eject an adhesive toward a reference position of each antenna of an antenna continuous body, the antenna continuous body having a base material and plural inlay antennas continuously formed on the base material;

a plurality of nozzles, each movable between a first position and a second position, each configured to suck an IC chip, when located at the first position, and to place the IC chip on the adhesive at the reference position of the corresponding antenna of the antenna continuous body, when located at the second position;

a nozzle attachment to which the plurality of nozzles is attached;

a rotating unit configured to rotate the nozzle attachment, such that the plurality of nozzles moves, on a surface orthogonal to the conveying surface, along a circular track, and a moving direction of each nozzle at the second position matches the conveying direction of the antenna continuous body; and a processor, wherein the processor is configured to:

determine whether an IC chip is sucked by each nozzle while each nozzle is moved from the first position to the second position; and control an angular velocity in rotating the nozzle attachment, so that a first nozzle of the plurality of nozzles that reaches the second position later than a non-sucking nozzle, places an IC chip on an antenna corresponding to the non-sucking nozzle, the non-sucking nozzle being a nozzle of the plurality of nozzles that has been determined as not sucking an IC chip.

2. The IC chip mounting apparatus according to claim 1, wherein the first nozzle is a nozzle having been determined by the processor as sucking an IC chip, and first reaching the second position after the non-sucking nozzle.

3. The IC chip mounting apparatus according to claim 2, further comprising an image acquisition unit configured to acquire an image of each nozzle at a position between the first position and the second position, wherein the processor is configured to determine whether an IC chip is sucked by each nozzle, based on the image acquired by the image acquisition unit.

4. The IC chip mounting apparatus according to claim 2, further comprising a plurality of control valves, each connected to a corresponding nozzle of the plurality of nozzles, each configured so that the corresponding nozzle performs a suction operation for sucking or a discharge operation for discharging air, wherein the processor is configured to control the plurality of control valves such that the non-sucking nozzle does not perform the suction operation.

5. The IC chip mounting apparatus according to claim 1, further comprising an image acquisition unit configured to acquire an image of each nozzle at a position between the first position and the second position, wherein the processor is configured to determine whether an IC chip is sucked by each nozzle, based on the image acquired by the image acquisition unit.

6. The IC chip mounting apparatus according to claim 5, wherein the processor is further configured to determine correction amounts for the IC chip sucked by each nozzle, based on the image acquired by the image acquisition unit, the correction amounts including a first correction amount for correcting an angle of each nozzle around a corresponding axis, a second correction amount for correcting a position of the antenna continuous body in a conveying direction thereof, and a third correction amount for correcting the position of the antenna continuous body in a width direction thereof.

7. The IC chip mounting apparatus according to claim 5, further comprising a plurality of control valves, each connected to a corresponding nozzle of the plurality of nozzles, each configured so that the corresponding nozzle performs a suction operation for sucking or a discharge operation for discharging air, wherein the processor is configured to control the plurality of control valves such that the non-sucking nozzle does not perform the suction operation.

8. The IC chip mounting apparatus according to claim 1, further comprising a plurality of control valves, each connected to a corresponding nozzle of the plurality of nozzles, each configured so that the corresponding nozzle performs a suction operation for sucking or a discharge operation for discharging air, wherein the processor is configured to control the plurality of control valves such that the non-sucking nozzle does not perform the suction operation.

9. The IC chip mounting apparatus according to claim 1, further comprising a plurality of control valves, each connected to a corresponding nozzle of the plurality of nozzles, each configured so that the corresponding nozzle performs a suction operation for sucking or a discharge operation for discharging air, wherein the processor is configured to control the plurality of control valves such that the non-sucking nozzle does not perform the discharge operation at the second position.

10. The IC chip mounting apparatus according to claim 1, wherein:

the ejection unit comprises a dispenser, and the rotating unit comprises a rotational drive motor.

11. An IC chip mounting method comprising:

ejecting, by a dispenser, an adhesive toward a reference position of each antenna of an antenna continuous body, the antenna continuous body having a base material and plural inlay antennas continuously formed on the base material;

rotating a nozzle attachment to which a plurality of nozzles is attached, each movable between a first position and a second position, such that:

a nozzle of the plurality of nozzles sequentially sucks an IC chip at the first position, the plurality of nozzles moves, on a surface orthogonal to the conveying surface, along a circular track, and a moving direction of each nozzle at the second position matches the conveying direction of the antenna continuous body;

determining whether an IC chip is sucked by each nozzle while each nozzle is moved from the first position to the second position;

with respect to each nozzle that has been determined as sucking an IC chip, placing the IC chip on the adhesive at the reference position of the corresponding antenna of the antenna continuous body, when each nozzle is located at the second position; and controlling an angular velocity in rotating the nozzle attachment, so that a first nozzle of the plurality of nozzles that reaches the second position later than a non-sucking nozzle, places an IC chip on an antenna corresponding to the non-sucking nozzle, the non-sucking nozzle being a nozzle of the plurality of nozzles that has been determined as not sucking an IC chip.

12. The IC chip mounting method according to claim 11, wherein the first nozzle is a nozzle having been determined by the determining as sucking an IC chip, and first reaching the second position after the non-sucking nozzle.

13. The IC chip mounting method according to claim 12, further comprising acquiring an image of each nozzle at a position between the first position and the second position, wherein the determining is performed based on the acquired image.

14. The IC chip mounting method according to claim 12, further comprising controlling a plurality of control valves, each connected to a corresponding nozzle of the plurality of nozzles, each configured so that the corresponding nozzle performs a suction operation for sucking or a discharge operation for discharging air, wherein the controlling the plurality of control valves is performed such that the non-sucking nozzle does not perform the suction operation.

15. The IC chip mounting method according to claim 11, further comprising acquiring an image of each nozzle at a position between the first position and the second position, wherein the determining is performed based on the acquired image.

16. The IC chip mounting method according to claim 15, further comprising determining correction amounts for the IC chip sucked by each nozzle, based on the acquired image, the correction amounts including a first correction amount for correcting an angle of each nozzle around a corresponding axis, a second correction amount for correcting a position of the antenna continuous body in a conveying direction thereof, and a third correction amount for correcting the position of the antenna continuous body in a width direction thereof.

17. The IC chip mounting method according to claim 15, further comprising controlling a plurality of control valves, each connected to a corresponding nozzle of the plurality of nozzles, each configured so that the corresponding nozzle performs a suction operation for sucking or a discharge operation for discharging air, wherein the controlling the plurality of control valves is performed such that the non-sucking nozzle does not perform the suction operation.

18. The IC chip mounting method according to claim 11, further comprising controlling a plurality of control valves, each connected to a corresponding nozzle of the plurality of nozzles, each configured so that the corresponding nozzle performs a suction operation for sucking or a discharge operation for discharging air, wherein the controlling the plurality of control valves is performed such that the non-sucking nozzle does not perform the suction operation.

19. The IC chip mounting method according to claim 11, further comprising controlling a plurality of control valves, each connected to a corresponding nozzle of the plurality of nozzles, each configured so that the corresponding nozzle performs a suction operation for sucking or a discharge operation for discharging air, wherein the controlling the plurality of control valves is performed such that the non-sucking nozzle does not perform the discharge operation at the second position.

* * * * *